(12) United States Patent
Song et al.

(10) Patent No.: US 11,329,250 B2
(45) Date of Patent: May 10, 2022

(54) DISPLAY DEVICE

(71) Applicant: Samsung Display Co., Ltd., Yongin-si (KR)

(72) Inventors: Ju Hee Song, Seoul (KR); Sang Hyo Park, Suwon-si (KR); Byoung Su Lee, Hwaseong-si (KR); Tae Hyeog Jung, Hwaseong-si (KR); Won Ju Choi, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 2 days.

(21) Appl. No.: 16/915,920

(22) Filed: Jun. 29, 2020

(65) Prior Publication Data

US 2021/0036259 A1 Feb. 4, 2021

(30) Foreign Application Priority Data

Jul. 31, 2019 (KR) .................. 10-2019-0093155

(51) Int. Cl.
*H01L 51/52* (2006.01)
*H01L 27/32* (2006.01)
*G09F 9/30* (2006.01)

(52) U.S. Cl.
CPC .......... *H01L 51/5246* (2013.01); *G09F 9/301* (2013.01); *H01L 27/323* (2013.01); *H01L 51/529* (2013.01); *H01L 51/5253* (2013.01); *H01L 51/5293* (2013.01)

(58) Field of Classification Search
CPC ............. H01L 51/5246; H01L 51/5293; H01L 51/5253; H01L 51/529; H01L 27/323; H01L 51/5281; H01L 51/0097; H01L 2251/5338; G09F 9/301; G06F 1/1616; G06F 1/1652; G02F 1/133305
See application file for complete search history.

(56) References Cited

U.S. PATENT DOCUMENTS

| 8,436,122 | B2 | 5/2013 | Kho et al. |
| 10,319,801 | B2 | 6/2019 | Kishimoto et al. |
| 10,586,941 | B2 | 3/2020 | Lee et al. |

(Continued)

FOREIGN PATENT DOCUMENTS

| KR | 10-0831562 | 5/2008 |
| KR | 10-1645066 | 8/2016 |

(Continued)

*Primary Examiner* — Kyoung Lee
(74) *Attorney, Agent, or Firm* — H.C. Park & Associates, PLC

(57) ABSTRACT

A display device includes: a display panel including a front surface and a rear surface, the rear side being opposite to the front side; a front stacked structure on the front surface including a front bonding member disposed on the front surface; and a rear stacked structure on the rear surface including a rear bonding member disposed on the rear surface. A loss tangent of the front bonding member has a value greater than a loss tangent of the rear bonding member, the loss tangent being represented by an equation: (loss tangent)=(loss modulus)/(storage modulus), wherein the loss modulus refers to energy lost by viscosity of a material, and the storage modulus refers to energy stored without loss by elasticity of the material.

18 Claims, 17 Drawing Sheets

(56) References Cited

U.S. PATENT DOCUMENTS

2006/0062938 A1* 3/2006 Takeko ............. G02F 1/133502
428/1.55
2012/0034451 A1   2/2012  Seo et al.
2018/0203321 A1   7/2018  Shin et al.
2019/0091970 A1   3/2019  Ueki et al.

FOREIGN PATENT DOCUMENTS

| KR | 10-2017-0084402 | 7/2017 |
| --- | --- | --- |
| KR | 10-1793047 | 11/2017 |
| KR | 10-2018-0021291 | 3/2018 |
| KR | 10-2018-0085399 | 7/2018 |
| KR | 10-2019-0006183 | 1/2019 |

* cited by examiner

DISPLAY DEVICE

CROSS REFERENCE TO RELATED APPLICATION

This application claims priority from and the benefit of Korean Patent Application No. 10-2019-0093155, filed on Jul. 31, 2019, which is hereby incorporated by reference for all purposes as if fully set forth herein.

BACKGROUND

Field

Exemplary embodiments/implementations of the invention relate generally to a display device, and, more specifically, to a foldable display device including a bonding member.

Discussion of the Background

With the development of multimedia, the importance of display devices is increasing. Accordingly, various types of display devices such as an organic light-emitting display (OLED) and a liquid crystal display (LCD) are in use. Such display devices are diversified in application examples, mainly in various mobile electronic devices, for example, portable electronic devices such as a smartphone, a smartwatch, a tablet personal computer (PC), and the like.

Recently, a foldable display device has been attracting a great deal of attention. The foldable display device may have good portability and a widescreen, thus having all the advantages of a smartphone and a tablet PC.

A folding operation of the foldable display device may apply stress to each layer constituting the foldable display device. When an adhesive layer used in the bonding of a laminated structure is exposed to such stress, the adhesive layer may suffer issues including a delamination failure or the like.

The above information disclosed in this Background section is only for understanding of the background of the inventive concepts, and, therefore, it may contain information that does not constitute prior art.

SUMMARY

Devices constructed according to exemplary embodiments of the invention are capable of providing a display device including a bonding member that is resistant to deformation from repeated folding operations and withstand against external impacts.

Additional features of the inventive concepts will be set forth in the description which follows, and in part will be apparent from the description, or may be learned by practice of the inventive concepts.

According to one or more exemplary embodiments of the invention, a display device includes: a display panel including: a first surface facing a front side of the display panel; and a second surface facing a rear side of the display panel, the rear side being opposite to the front side; a front stacked structure on the first surface of the display panel, the front stacked structure including a front bonding member disposed on the first surface of the display panel; and a rear stacked structure on the second surface of the display panel, the rear stacked structure including a rear bonding member disposed on the second surface of the display panel, wherein a loss tangent of the front bonding member has a value greater than a loss tangent of the rear bonding member, the loss tangent of the front bonding member and the rear bonding member being represented by a following equation: (loss tangent)=(loss modulus)/(storage modulus), wherein the loss modulus of the front bonding member and the rear bonding member refers to energy lost by viscosity of a material of the front bonding member and the rear bonding member, and wherein the storage modulus the front bonding member and the rear bonding member refers to energy stored without loss by elasticity of the material of the front bonding member and the rear bonding member.

The storage modulus of the rear bonding member may have a larger value than the storage modulus of the front bonding member.

An average value of the loss tangent of the front bonding member may be equal to or greater than 1.5 at an ambient temperature of 25° C., and an average value of the storage modulus of the rear bonding member may be equal to or greater than 2 MPa at the ambient temperature of 25° C.

The values of the loss tangent and the storage modulus of the front bonding member and the rear bonding member may be measured during a high-speed behavior of equal to or greater than 30,000 Hz at the ambient temperature of 25° C.

Each of the front bonding member and the rear bonding member may have a thickness equal to or less than 50 μm.

Each of the front bonding member and the rear bonding member may have an elastic modulus of: equal to or less than 300 kPa at the ambient temperature of −20° C.; and equal to or less than 50 kPa at the ambient temperature of 25° C.

The front stacked structure may include: a cover window; a window bonding member attaching the cover window to the first surface of the display panel; a cover window protective layer disposed in front of the cover window; and a protective layer bonding member attaching the cover window protective layer on the cover window, and a loss tangent of the protective layer bonding member may have a larger value than a loss tangent of the window bonding member.

The loss tangent of the front bonding member may have a larger value than the loss tangent of the window bonding member.

A storage modulus of the window bonding member may have a larger value than a storage modulus of the protective layer bonding member and may have a smaller value than a storage modulus of the rear bonding member.

The front stacked structure further may include: a polarizing member disposed between the display panel and the cover window; and a polarizing member bonding member attaching the polarizing member on the first surface of the display panel, and a storage modulus of the polarizing member bonding member may have a smaller value than the storage modulus of the rear bonding member.

The rear stacked structure may include: a polymer film layer disposed in the rear of the display panel; and a heat dissipation member disposed in the rear of the polymer film layer.

The rear stacked structure may further include: a polymer film bonding member attaching the polymer film layer on the second surface of the display panel; and a heat dissipation member bonding member attaching the heat dissipation member on the second surface of the display panel, and an average value of storage modulus of the polymer film bonding member and the heat dissipation member bonding member may be larger than an average value of storage modulus of the window bonding member and the protective layer bonding member.

An average value of loss tangents of the window bonding member and the protective layer bonding member may be larger than an average value of loss tangents of the polymer film bonding member and the heat dissipation member bonding member.

The display panel displays an image toward the front side.

The display device may be an in-foldable display device configured to fold in such a way that a display surface faces inward.

According to one or more exemplary embodiments of the invention, a display device includes an in-foldable device configured to fold in such a way that a display surface faces inward, the display device including: a display panel including a first surface positioned on a front side of the display panel and a second surface positioned on a rear side of the display panel, the display panel configured to display an image towards the front side; a front stacked structure disposed on the first surface of the display panel; and a rear stacked structure disposed on the second surface of the display panel, wherein the front stacked structure and the rear stacked structure each includes at least one bonding member each having a thickness equal to or less than 50 μm, and wherein an average value of a loss tangent of the at least one bonding member of the front stacked structure is larger than an average value of a loss tangent of the at least one bonding member of the rear stacked structure, the loss tangent of the at least one bonding member of the front and rear stacked structures being represented by a following equation: (loss tangent)=(loss modulus)/(storage modulus), wherein the loss modulus of the at least one bonding member refers to energy lost by viscosity of a material of the at least one bonding member, and wherein the storage modulus of the at least one bonding member refers to energy stored without loss by elasticity of the material of the at least one bonding member.

The average value of the storage modulus of the at least one bonding member of the rear stacked structure may be larger than an average value of storage modulus of the front stacked structure.

An average value of the loss tangent of each of the at least one bonding member of the front stacked structure may be equal to or greater than 1.5 at the ambient temperature of 25° C., and an average value of the storage modulus of each of the at least one bonding member of the rear stacked structure may be equal to or greater than 2 MPa at the ambient temperature of 25° C.

The values of the loss tangents and the storage modulus of the at least one bonding member of the front stacked structure and the rear stacked structure may be measured during a high-speed behavior of equal to or greater than 30,000 Hz at the ambient temperature of 25° C.

The at least one bonding member of the front stacked structure and the at least one bonding member of the rear stacked structure may have an elastic modulus equal to or less than 300 kPa at the ambient temperature of −20° C. and a modulus equal to or less than 50 kPa at the ambient temperature of 25° C., respectively.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
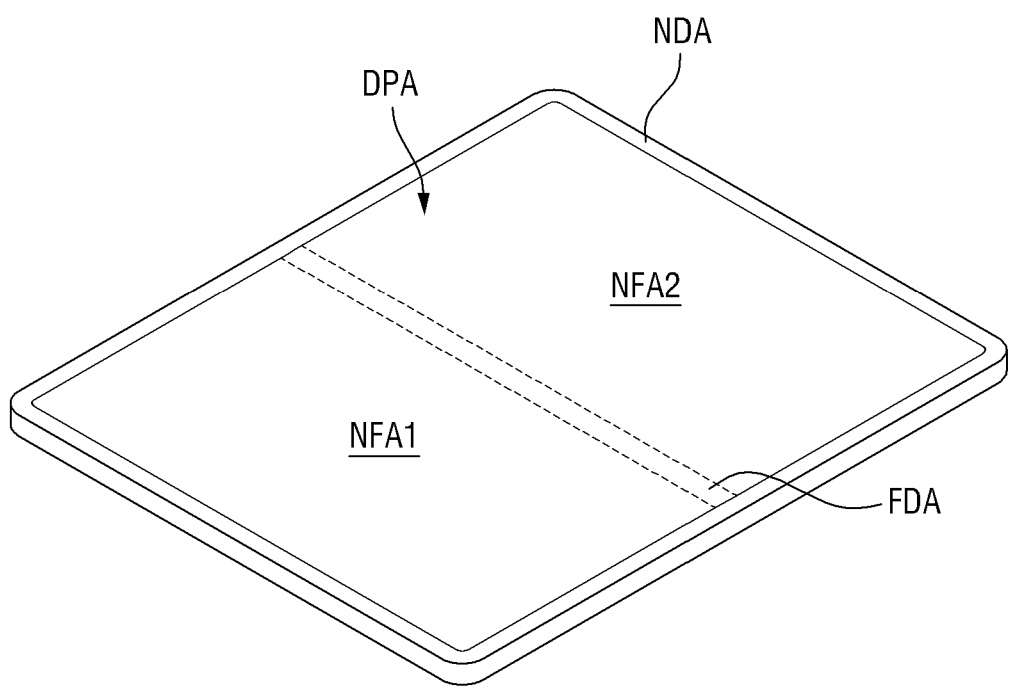
FIG. 1 is a perspective view of a display device according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
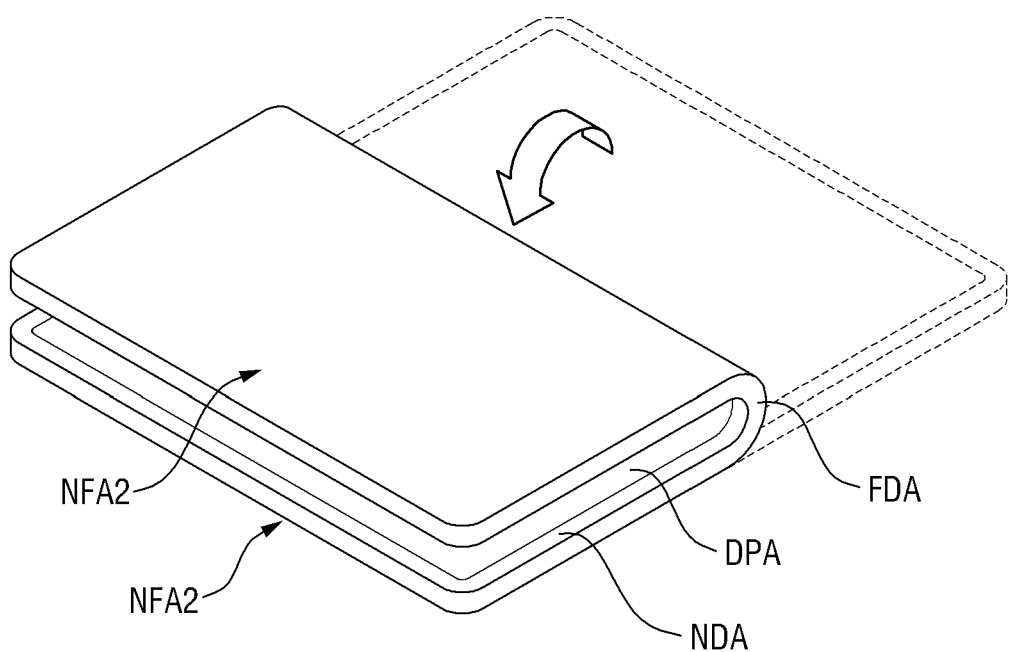
FIG. 2 is a perspective view illustrating a state in which the display device of FIG. 1 is folded.

FIG. 1 is a perspective view of a display device according to an exemplary embodiment. FIG. 2 is a perspective view illustrating a state in which the display device of FIG. 1 is folded.

Referring to FIGS. 1 and 2, a display device 10 displays a video or an image through a display area DPA and may include various devices including the display area DPA. Examples of the display device 10 may include, but are not limited to, a smartphone, a mobile phone, a tablet personal computer (PC), a personal digital assistant (PDA), a portable multimedia player (PMP), a television, a gaming machine, a wrist-watch type electronic device, a head-mounted display, a monitor of a PC, a notebook computer, a car navigation system, a car dashboard, a digital camera, a camcorder, an external advertisement board, an electric signboard, various medical devices, various inspection devices, various household appliances such as a refrigerator, a washing machine, or the like which includes a display area DPA, an Internet of Things (IoT) device, and the like. Representative examples of a foldable display device to be described below may include, but are not limited to, a foldable smartphone, a tablet PC, a notebook computer, and the like.

The display device 10 may have a substantially rectangular shape in a plan view. The display device 10 may have a rectangular shape of which a corner has a right angle in a plan view or a rectangular shape of which a corner is round in a plan view. The display device 10 may include four sides or edges. The display device 10 may include long sides and short sides.

The display device 10 may include one surface and the other surface. At least one of one surface and the other surface of the display device 10 may be a display surface. In an exemplary embodiment, the display surface may be positioned on one surface of the display device 10 and display may not be performed in a direction of the other surface. Although the following description will focus on such an exemplary embodiment, the display device may also be a double-sided display device in which display is performed on both one surface and the other surface thereof.

The display device 10 may be divided into a display area DPA that displays a video or an image and a non-display area NDA that is disposed around the display area DPA depending on whether the video or image is displayed in a plan view.

The display area DPA may include a plurality of pixels. Each of the pixels is a basic unit for displaying a screen. The pixel may include, but is not limited to, a red pixel, a green pixel, and a blue pixel. The pixel may further include a white pixel. The plurality of pixels may be alternately arranged in a plan view. For example, the pixels may be arranged in a matrix form, but the present disclosure is not limited thereto.

The non-display area NDA may be disposed around the display area DPA. The non-display area NDA may surround the display area DPA. In an exemplary embodiment, the display area DPA is formed in a rectangular shape, and the non-display area NDA may be disposed around four sides of the display area DPA, but the present disclosure is not limited thereto. A black matrix may be disposed in the non-display area NDA to prevent or suppress light emitted from adjacent pixels from leaking.

The display device 10 may be a foldable device. The term "foldable device" used in the present specification means a device capable of folding and is interpreted as including a device capable of having both a folded state and a non-folded state as well as a folded device. Further, the folded state typically includes being folded at an angle of about 180° C., but the present disclosure is not limited thereto and it may be understood as being the folded state even when the folded angle is greater than or less than 180°, for example, the folded angle is 90° or more and less than 180° or 120° or more and less than 180°. Moreover, when the display device 10 is in a state of being bent out of the non-folded state, it may be referred to as the folded state even when the folding is not completely performed. For example, when the maximum folded angle is 90° or more, it may be expressed as being in the folded state to be distinguished from the non-folded state even when the display device 10 is bent at an angle of 90° or less. The radius of curvature ('R' in FIG. 4) when folded may be 5 mm or less, and preferably, in the range of 1 mm to 2 mm, or about 1.5 mm, but the present disclosure is not limited thereto.

The display device 10 may be folded on the basis of a folding line FDA (or a folding axis). The folding line FDA may have a straight line shape that extends in one direction in a plan view. Although the case in which the folding line FDA extends parallel to the short side of the display device 10 is illustrated in the drawing, the present disclosure is not limited thereto, and the folding line FDA may be parallel to the long side of the display device 10 or may be tilted with respect to the short side and the long side.

In an exemplary embodiment, the folding line FDA of the display device 10 may be fixed at a specific position. In the display device 10, one or more folding lines FDA may be provided at the specific position. In another exemplary embodiment, the positions of the folding lines FDA are not specified in the display device 10 and may be freely set in various areas.

The display device 10 may be divided into a first non-folded area NFA1 and a second non-folded area NFA2 on the basis of the folding line FDA. The first non-folded area NFA1 may be positioned on one side of the folding line FDA, and the second non-folded area NFA2 may be positioned on the other side of the folding line FDA. When the folding line FDA is fixed at a specific position, the first non-folded area NFA1 and the second non-folded area NFA2 may be specified as areas in which the folding is not performed. The specified first non-folded area NFA1 and second non-folded area NFA2 may have the same width, but the present disclosure is not limited thereto. When the folding line FDA is not specified, the first non-folded area NFA1 and the second non-folded area NFA2 may have different areas depending on the position in which the folding line FDA is set.

The display area DPA of the display device 10 may be disposed over both the first non-folded area NFA1 and the second non-folded area NFA2. Furthermore, the display area DPA may also be positioned on the folding line FDA corresponding to a boundary between the first non-folded area NFA1 and the second non-folded area NFA2. That is, the display area DPA of the display device 10 may be disposed continuously regardless of the boundary between the non-folded areas NFA1 and NFA2, the folding lines FDA, and the like. However, the present disclosure is not limited thereto, and the display area DPA may be disposed in the first non-folded area NFA1 but may not be disposed in the second non-folded area NFA2, and the display area DPA may be disposed in the first non-folded area NFA1 and the second non-folded area NFA2 but the non-display area NDA may not be disposed in the folding line FDA.

Figure 17:
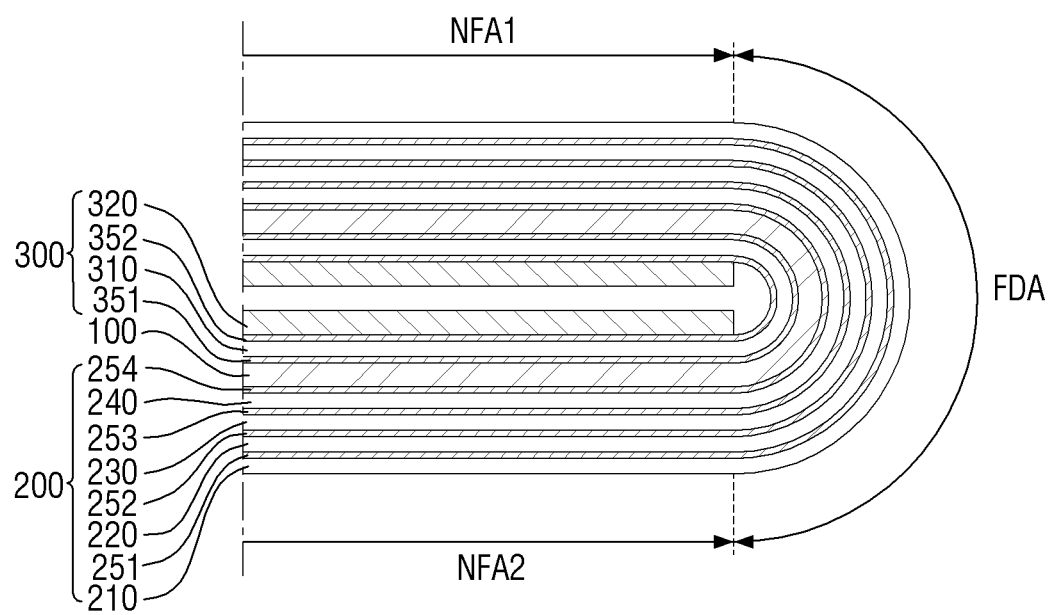
FIG. 17 is a cross-sectional view of a display device in a folded state according to still yet another exemplary embodiment.

The display device 10 may be folded by an in-folding method in which the display device 10 is folded such that the display surfaces face each other while facing inward (illustrated in FIG. 2) or may be folded by an out-folding method in which the display device 10 is folded such that the display surfaces face outward (illustrated in FIG. 17). The display device 10 may be folded by only one of the in-folding method and the out-folding method, or both the in-folding and the out-folding may be performed. In the case of the display device 10 in which both the in-folding and the out-folding are performed, the in-folding and the out-folding may be performed on the basis of the same folding line FDA, or the display device may include a plurality of folding lines FDA such as an in-folding dedicated folding line and an out-folding dedicated folding line, in which different types of folding are performed.

In an exemplary embodiment, the display panel and a layer, a panel, and a substrate that are stacked on the display panel may have their own flexible characteristics so that corresponding members may all be folded, and thus the display device 10 may be folded. In some exemplary embodiments, at least some of the display panel or the members stacked on the display panel may have a shape that is separated on the basis of the folding line FDA. In this case, the separated members that are positioned in the non-folded area may not have flexible characteristics.

Figure 3:
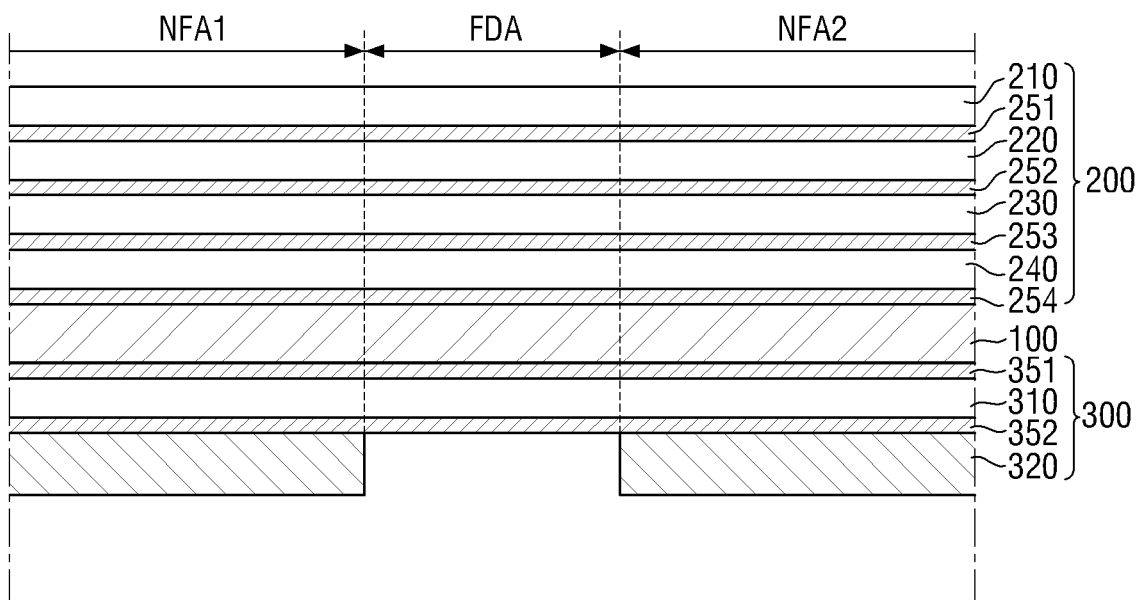
FIG. 3 is a cross-sectional view of the display device in an non-folded state according to an exemplary embodiment.
Figure 4:
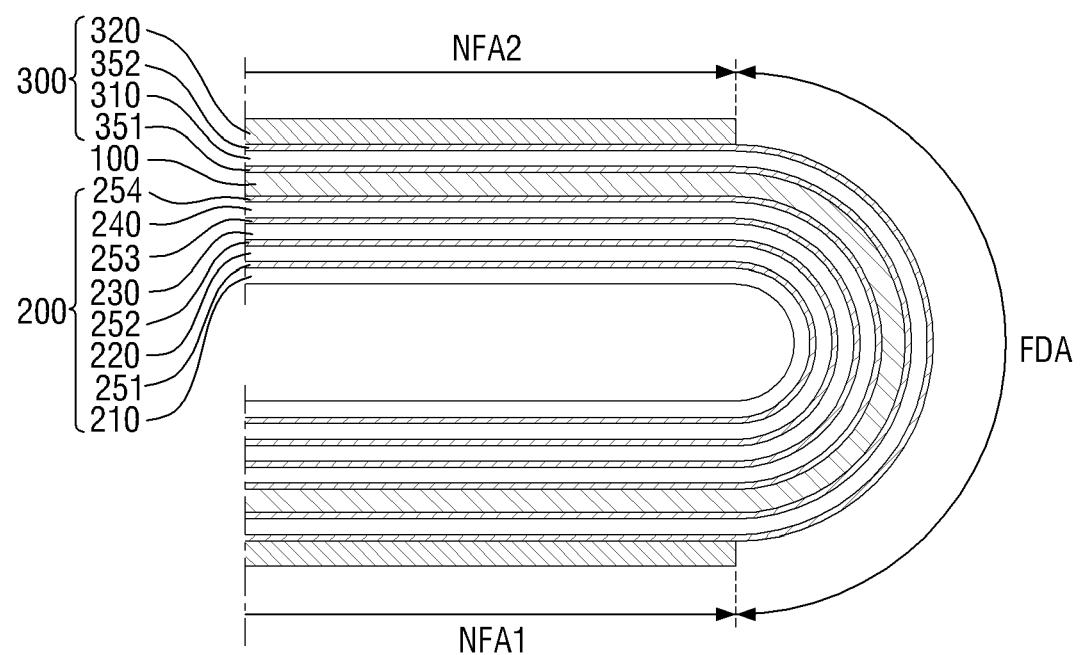
FIG. 4 is a cross-sectional view of the display device, in which the display device is in a folded state, according to an exemplary embodiment.

FIG. 3 is a cross-sectional view of the display device, in which the display device is in an non-folded state, according to an exemplary embodiment. FIG. 4 is a cross-sectional view of the display device, in which the display device is in a folded state, according to an exemplary embodiment.

Referring to FIGS. 3 and 4, the display device 10 may include a display panel 100, a front stacked structure 200 that is stacked in front of the display panel 100, and a rear stacked structure 300 that is stacked in the rear of the display panel 100. Each of the stacked structures 200 and 300 may include at least one of bonding members 251, 252, 253, 254, 351, and 352. Here, the direction "in front" of the display panel 100 is the direction in which the display panel 100 displays an image, and the direction "to the rear" of the display panel 100 is the opposite direction. One surface of the display panel 100 is positioned on a front side of the display panel 100, and the other surface of the display panel 100 is positioned on a rear side of the display panel 100.

The display panel 100 is a panel configured to display a video or an image, and examples thereof may include a light-receiving display panel such as a liquid-crystal display (LCD) panel and an electrophoretic display (EPD) panel, as well as a self-luminous display panel such as an organic light-emitting display (OLED) panel, an inorganic electroluminescent (EL) display panel, a quantum dot light-emitting display (QED) panel, a micro light-emitting (LED) display panel, a nano-LED display panel, a plasma display panel (PDP), a field-emission display (FED) panel, a cathode ray tube (CRT) display panel. Hereinafter, the OLED panel will be described as an example of the display panel 100, and the OLED panel applied to the exemplary embodiments will be simply referred to as the display panel 100 unless a special classification is required. However, the exemplary embodiments are not limited to the OLED panel, and other display panels listed above or known in the art may be applied to the display panel 100 to the extent that technical ideas are shared.

According to an exemplary embodiment, the front stacked structure 200 is disposed in front of the display panel 100. The front stacked structure 200 may include a touch member 240, a polarizing member 230, a cover window 220, and a cover window protective layer 210 which are sequentially stacked frontward from the display panel 100.

The touch member 240 may acquire position information of an input point by a capacitive method, a resistive method, an electromagnetic induction method, an infrared method, or the like. In the present embodiment, the touch member 240 of a capacitive method is exemplified, but the present disclosure is not limited thereto.

The touch member 240 may include a base material for touch and a sensing portion. The touch member 240 may have various shapes like the display panel 100. The touch member 240 may be made of glass or plastic such as polyethylene terephthalate (PET), polyimide (PI), polycarbonate (PC), polyethylene (PE), polypropylene (PP), polysulfone (PSF), polymethylmethacrylate (PMMA), triacetyl cellulose (TAC), or cycloolefin polymer (COP). Further, the touch member 240 includes the plastic base material and thus may have flexible characteristics and may also be folded or bent together with the display panel 100 as described above.

The sensing portion of the touch member 240 includes a touch electrode and/or a touch wiring and thus may acquire position information of a touched point by a self-capacitance method and/or a mutual capacitance method.

However, the present disclosure is not limited thereto, and the touch member 240 may be included in the display panel 100. That is, as shown in FIGS. 3 and 4, the touch member 240 may be provided as a separate panel or film from the display panel 100 and attached on the display panel 100 but may be provided inside the display panel 100 in the form of a touch layer.

Figure 5:
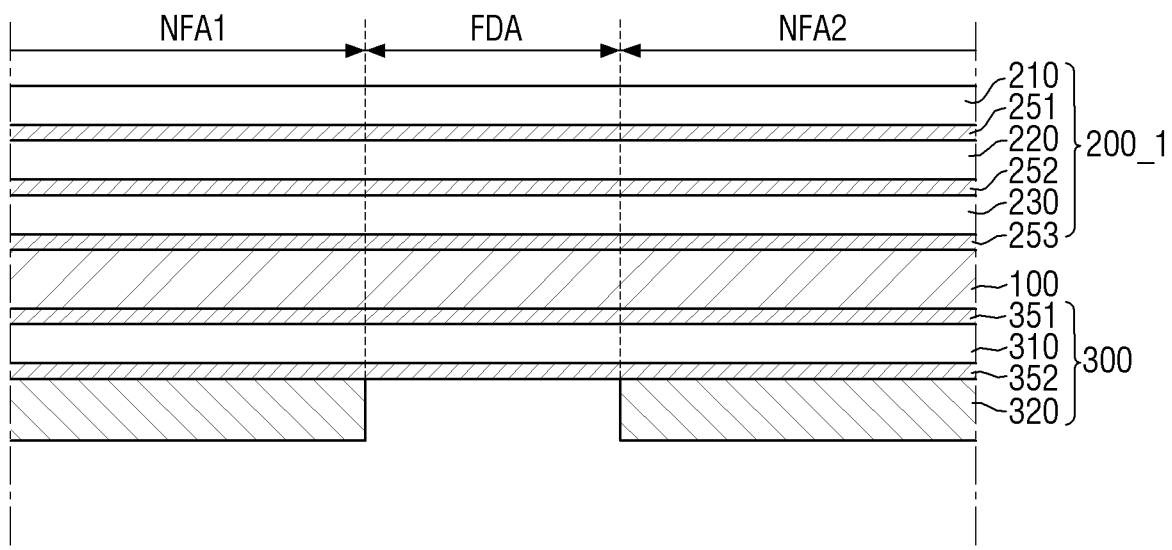
FIG. 5 is a cross-sectional view of a display device, in which the display device is in a non-folded state, according to another exemplary embodiment.
Figure 6:
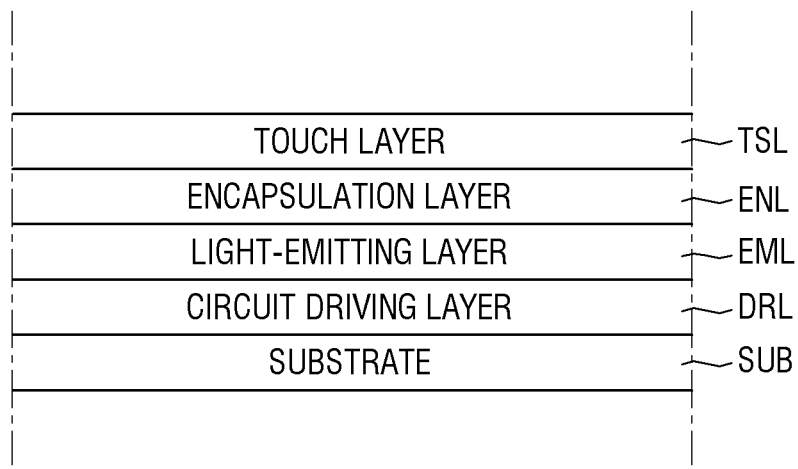
FIG. 6 is a cross-sectional view of a display panel according to an exemplary embodiment.

FIG. 5 is a cross-sectional view of a display device according to another exemplary embodiment and FIG. 6 is a cross-sectional view of the display panel according to an exemplary embodiment.

Referring to FIGS. 5 and 6, the touch member 240 is provided in the form of a separate touch layer TSL in the display panel 100, and therefore, the touch member 240 and a fourth bonding member 254 for bonding the touch member 240 and the display panel 100 to each other may be omitted from the front stacked structure 200-1 of the display device 11. The display device 11 of FIG. 5 is the same as the display device 10 of FIG. 3 except that the touch member 240 is separately provided in the form of the touch layer TSL in the display panel 100 so that the fourth bonding member 254 is omitted. Thus, duplicated descriptions will be omitted.

According to an exemplary embodiment, the display panel 100 may include a substrate SUB, a circuit driving layer DRL disposed on the substrate SUB, a light-emitting layer EML disposed on the circuit driving layer DRL, an encapsulation layer ENL disposed on the light-emitting layer EML, and a touch layer TSL disposed on the encapsulation layer ENL.

The substrate SUB may include a flexible substrate having a flexible polymer material such as polyimide. Accordingly, the display panel 100 may be bent, folded, or rolled. In some exemplary embodiments, the substrate may include a plurality of sub-substrates that overlap each other in a thickness direction with a barrier layer therebetween. In this case, each of the sub-substrates may be a flexible substrate.

The circuit driving layer DRL may be disposed on the substrate SUB. The circuit driving layer DRL may include a circuit configured to drive the light-emitting layer EML of the pixel. The circuit driving layer DRL may include a plurality of thin-film transistors.

The light-emitting layer EML may be disposed on the circuit driving layer DRL. The light-emitting layer EML may include an organic light-emitting layer. The light-emitting layer EML may emit light with various degrees of luminance according to a driving signal transmitted from the circuit driving layer DRL.

The encapsulation layer ENL may be disposed on the light-emitting layer EML. The encapsulation layer ENL may include an inorganic layer or a stacked layer of an inorganic layer and an organic layer.

The touch layer TSL may be disposed on the encapsulation layer ENL. The touch layer TSL is a layer that recognizes a touch input and may perform the function of a touch member. The touch layer TSL may include a plurality of sensing areas and sensing electrodes.

Referring to FIGS. 3 and 4 again, the polarizing member 230 polarizes light passing therethrough. The polarizing member 230 may serve to reduce reflection of external light. In an exemplary embodiment, the polarizing member 230 may include a polarizing film. The polarizing film may include a polarizing layer and a protective base material sandwiching the polarizing layer from above and below. The polarizing layer may include a polyvinyl alcohol film. The polarizing layer may be stretched in one direction. The stretching direction of the polarizing layer may become an absorption axis, and a direction perpendicular thereto may become a transmission axis. The protective base material may be disposed on each of one surface and the other surface of the polarizing layer. The protective base material may be made of, but is not limited to, a cellulose resin such as triacetyl cellulose, a polyester resin, or the like.

The cover window 220 may be disposed in front of the polarizing member 230. The cover window 220 serves to protect the display panel 100. The cover window 220 may be made of a transparent material. The cover window 220 may include, for example, glass or plastic.

When the cover window 220 includes glass, the glass may be ultra-thin glass (UTG) or thin glass. When the glass is made of an ultra-thin film or a thin film, the cover window 220 may have a flexible characteristic and thus may have a characteristic of being bendable, foldable, or rollable. The thickness of the glass may be, for example, in the range of 10 μm to 300 μm, and specifically, glass having a thickness of 30 μm to 80 μm or a thickness of about 50 μm may be applied. The glass of the cover window 220 may include soda-lime glass, alkali alumino silicate glass, borosilicate glass, or lithium alumina silicate glass. The glass of the cover window 220 may include glass that is chemically or thermally strengthened to have high strength. The chemical strengthening may be performed through an ion exchange treatment process in an alkali salt. The ion exchange treatment process may be performed two or more times.

When the cover window 220 includes plastic, it may be more advantageous to exhibit flexible characteristics such as folding. Examples of the plastic applicable to the cover window 220 may include, but are not limited to, polyimide, polyacrylate, polymethylmethacrylate (PMMA), polycarbonate (PC), polyethylenenaphthalate (PEN), polyvinylidene chloride, polyvinylidene difluoride (PVDF), polystyrene, an ethylene vinylalcohol copolymer, polyethersulphone (PES), polyetherimide (PEI), polyphenylene sulfide (PPS), polyallylate, tri-acetyl cellulose (TAC), cellulose acetate propionate (CAP), and the like. The plastic cover window 220 may include one or more of the plastic materials listed above.

The cover window protective layer 210 may be disposed in front of the cover window 220. The cover window protective layer 210 may perform at least one of scattering prevention, shock absorption, dent prevention, anti-fingerprint, anti-glare, and the like of the cover window 220. The cover window protective layer 210 may include a transparent polymer film. The transparent polymer film may include at least one of a polyethylene terephthalate (PET) resin, a polyethylene naphthalate (PEN) resin, a polyether sulfone (PES) resin, a polyimide (PI) resin, a polyarylate (PAR) resin, a polycarbonate (PC) resin, a polymethyl methacrylate (PMMA) resin, and a cycloolefin copolymer (COC) resin.

The front stacked structure 200 may include front bonding members 251, 252, 253, 254 that bond adjacent stacked members. For example, a first bonding member 251 may be disposed between the cover window 220 and the cover window protective layer 210 to bond the cover window 220 and the cover window protective layer 210, a second bonding member 252 may be disposed between the cover window 220 and the polarizing member 230 to bond the cover window 220 and the polarizing member 230, a third bonding member 253 may be disposed between the polarizing member 230 and the touch member 240 to bond the polarizing member 230 and the touch member 240, and the fourth bonding member 254 may be disposed between the touch member 240 and the display panel 100 to bond the touch member 240 and the display panel 100. That is, the front bonding members 251, 252, 253, 254 are members for attaching the layers on one surface of the display panel 100, and the first bonding member 251 may be a protective layer bonding member for attaching the cover window protective layer 210, the second bonding member 252 may be a window bonding member for attaching the cover window 220, the third bonding member 253 may be a polarizing member bonding member for attaching the polarizing member 230, and the fourth bonding member 254 may be a touch portion bonding member for attaching the touch member 240. The front bonding members 251 to 253 may all be optically transparent. Further, as described above, when the touch member 240 is provided in the form of a touch layer and included in the display panel 100, the fourth bonding member 254 for bonding the touch member 240 and the display panel 100 to each other may be omitted (as shown in FIG. 5).

The rear stacked structure 300 is disposed in the rear of the display panel 100. The rear stacked structure 300 may include a polymer film layer 310 and a heat dissipation member 320 that are sequentially stacked rearward from the display panel 100.

The polymer film layer 310 may include a polymer film. The polymer film layer 310 may include, for example, polyimide (PI), polyethylene terephthalate (PET), polycarbonate (PC), polyethylene (PE), polypropylene (PP), polysulfone (PSF), polymethyl methacrylate (PMMA), triacetyl cellulose (TAC), a cycloolefin polymer (COP), and the like. The polymer film layer 310 may include a functional layer on at least one surface thereof. The functional layer may include, for example, a light absorbing layer. The light absorbing layer may include a light absorbing material such as a black pigment or dye. The light absorbing layer may be formed on the polymer film by a coating or printing method with black ink.

The heat dissipation member 320 may be disposed in the rear of the polymer film layer 310. The heat dissipation member 320 serves to diffuse heat generated by the display panel 100 and other components of the display device 10. The heat dissipation member 320 may include a metal plate. The metal plate may include a metal having excellent thermal conductivity, such as copper, silver, and the like. The heat dissipation member 320 may include a heat dissipation sheet containing graphite, carbon nanotubes, or the like.

As shown in FIGS. 3 and 4, the heat dissipation member 320 may be separated around the folding line FDA in order to smooth the folding of the display device 10, but the present disclosure is not limited thereto. For example, a first metal plate may be disposed in the first non-folded area NFA1 and a second metal plate may be disposed in the second non-folded area NFA2. The first metal plate and the second metal plate may be physically spaced apart from each other about the folding line FDA.

The rear stacked structure 300 may include rear bonding members 351 and 352 that bond adjacent stacked members. For example, a fifth bonding member 351 may be disposed between the display panel 100 and the polymer film layer 310 to bond the display panel 100 and the polymer film layer 310, and a sixth bonding member 352 may be disposed between the polymer film layer 310 and the heat dissipation member 320 to bond the polymer film layer 310 and the heat dissipation member 320. That is, the rear bonding members 351 and 352 are members for attaching the layers on the other surface of the display panel 100, and the fifth bonding member 351 may be a polymer film bonding member for attaching the polymer film layer 310, and the sixth bonding member 352 may be a heat dissipation member bonding member for attaching the heat dissipation member 320. When the heat dissipation member 320 is separated about the folding line FDA, the sixth bonding member 352 may also be separated in the same shape as that of the heat dissipation member 320 but may be formed as one without being separated by the non-folded areas NFA1 and NFA2 as shown in FIG. 3.

When the display device 10 displays only on a front surface, the rear bonding members 351 and 352 need not necessarily be optically transparent, unlike the front bonding members 251, 252, 253, 254.

The front bonding members 251, 252, 253, 254 and the rear bonding members 351 and 352 described above may each include an adhesive material. Each of the bonding members may include a pressure-sensitive adhesive layer. Each of the bonding members may have the same composition but may have a different composition depending on a position thereof and the target to be bonded.

Some of the front bonding members 251, 252, 253, 254 may include an optically transparent adhesive layer or an optically transparent resin. For example, the second bonding member 252 that bonds the cover window 220 on the display panel 100 may include an optically transparent adhesive layer or an optically transparent resin. However, the present disclosure is not limited thereto.

The first to sixth bonding members 251, 252, 253, 254, 351, and 352 may each have a thickness of 50 µm or less. As described above, the display device 10 may be a foldable device, and the plurality of bonding members 251, 252, 253, 254, 351, and 352 included in the display device 10 may each have a thickness within a predetermined range so as not to be separated from other members even when the display device 10 is folded and/or non-folded several times. In an exemplary embodiment, the thickness of each of the bonding members 251, 252, 253, 254, 351, and 352 may all be 50 µm or less, or at least some of the bonding members 251, 252, 253, 254, 351, and 352 may have a thickness of 50 µm or less. Although there is no restriction on a lower limit of the thickness of each of the bonding members 251, 252, 253, 254, 351, and 352, in order to have minimal adhesion and durability even when the display device 10 is folded, the bonding members 251, 252, 253, 254, 351, and 352 may each have a thickness of 10 µm or more.

Each of the bonding members 251, 252, 253, 254, 351, and 352 may be formed of a single adhesive layer or may be formed of a plurality of stacked adhesive layers or may include an adhesive layer on one surface and the other surface of a base material like a double-sided tape.

In some exemplary embodiments, the bonding members 251, 252, 253, 254, 351, and 352 may each include a silicone-based adhesive. The silicone-based adhesive may include a siloxane resin. Specifically, the silicone-based adhesive may include a silicone gum containing a polyorganosiloxane compound. The silicone gum may include a cross-linkable functional group such as a vinyl group. The silicone-based adhesive may further include an MQ resin having a molecular structure of a three-dimensional network structure including a monofunctional siloxane unit and a tetrafunctional siloxane unit. The silicone-based adhesive may further include an additive containing at least one of a borane compound and a borate compound.

In some exemplary embodiments, the bonding members 251, 252, 253, 254, 351, and 352 may each include an acrylic-based adhesive. The acrylic-based adhesive may include an acrylic-based polymer. The acrylic-based polymer is obtained by polymerizing an acrylic-based monomer and may be a main material of the acrylic-based adhesive. The acrylic-based monomer may include ethyl acrylate, n-butyl acrylate, t-butyl acrylate, isobutyl acrylate, n-hexyl acrylate, 2-ethylhexyl acrylate, n-octyl acrylate, isooctyl acrylate, n-nonyl acrylate, isononyl acrylate, n-decyl acrylate, isodecyl acrylate, n-dodecyl acrylate, n-tridecyl acrylate, n-tetradecyl acrylate, 2-(2-Ethoxyethoxy)ethyl acrylate, 2-hydroxyethyl acrylate, 2-hydroxypropyl acrylate, 3-hydroxypropyl acrylate, 2-hydroxybutyl acrylate, 4-hydroxybutyl acrylate, 6-hydroxyhexyl acrylate, 8-hydroxyoctyl acrylate, 10-hydroxydecyl acrylate, 12-hydroxy lauryl acrylate, [4-(hydroxymethyl)cyclohexyl] methyl acrylate, or the like. The acrylic-based adhesive may further include, in addition to the acrylic-based polymer, an azo-based initiator such as 2,2'-azobisisobutyronitrile, a filler such as silica or zirconia, a crosslinking agent, an anti-static agent such as polyethylenedioxythiophene:polystyrene sulfonic acid (PEDOT:PSS). In an exemplary embodiment, the acrylic-based adhesive may be produced by mixing 120 parts by weight to 250 parts by weight of the acrylic-based monomer with a solvent and heating the mixture while stirring and then adding 0.1 to 1 part by weight of an azo-based initiator, 0.5 to 1 part by weight of a filler, 1.5 to 2.5 parts by weight of a crosslinking agent, and 0.5 to 1 part by weight of an anti-static agent to the solution, followed by heating while stirring.

In some other embodiments, the bonding members 251, 252, 253, 254, 351, and 352 may include a crystalline polymer and a rubber-based polymer. The crystalline polymer may include one of polypropylene, syndiotatic polystyrene, polyamide, polycaprolactone, polycarbonate-diol, polyethylene terephthalate (PET), polyphenylene sulfide, polybutylene terephthalate (PBT), polyarylate (PAR), poly (DPAA), polyether imide (PEI), polyacetal, polyoxymethylene (POM), and the like.

The rubber-based polymer may include polybutadiene, polyisoprene, polyneoprene, polyisobutylene, cellulose acetate, polyvinyl acetate, or a copolymer thereof. The weight ratio of the crystalline polymer and the rubber-based polymer may be in the range of 1:0.3 or more to 1:1.5 or less. Furthermore, the bonding member may further include a carbamic acid ester-based polymer, an ester-based polymer and/or a (meth) acrylic acid ester-based polymer and may further include a coupling agent such as a silane-based coupling agent, a titanate-based coupling agent, a chromium-based coupling agent, and an adhesion promoter such as a rosin resin, a rosin ester resin, a terpene phenol resin, a terpene resin, an anti-yellowing agent, an antioxidant, or the like.

The materials and compositions of the bonding members 251, 252, 253, 254, 351, and 352 are not limited to those illustrated above, and other materials and compositions of adhesive materials known in the art may be applied thereto.

The front bonding members 251, 252, 253, 254 and the rear bonding members 351 and 352 may each have adhesive physical properties such as an elastic modulus, a creep characteristic, and peel strength. Among these, the elastic modulus is related to deformation or restoration against the pressure applied to the adhesive layer, and the peel strength is related to adhesion of the adhesive layer. Further, the bonding members 251, 252, 253, 254, 351, and 352 may be exposed to different stress conditions depending on the positions thereof such that different adhesive physical properties may be required for each position.

In more detail, when the display device 10 that has the stacked structure as described above is folded, the layers constituting the display device 10 may be subjected to different stresses. For example, when the display device 10 is folded by an in-folding method in which the display surfaces are folded so as to face each other while facing inward, layers near one surface of the display device 10, which forms the display surface, are subjected to compressive stress and layers near the other surface of the display device 10 may be subjected to tensile stress. The compressive stress is maximized at one surface of the display device 10, and the amount of the compressive stress may become smaller toward the other surface of the display device 10 along the thickness direction. The tensile stress is maximized at the other surface of the display device 10, and the amount of the tensile stress may become smaller toward one surface of the display device 10 along the thickness direction.

Since the bonding members 251, 252, 253, 254, 351, and 352 of the display device 10 are exposed to various stresses described above during the folding operation of the display device 10, the bonding members 251, 252, 253, 254, 351, and 352 need to have proper adhesive physical properties to maintain adhesion and to have restoring force even in repeated folding operations. In the exemplary embodiment, the bonding members 251, 252, 253, 254, 351, and 352 of the display device 10 may each have an elastic modulus value of 300 kPa or less when measured at the ambient temperature of −20° C. and an elastic modulus value of 50 kPa or less when measured at the ambient temperature of 25° C. As described above, the display device 10 may be a foldable device and may have a modulus value within the above-described range to enable the folding operation of the display device 10 and simultaneously maintain adhesion even when stress is applied to the bonding members 251, 252, 253, 254, 351, and 352.

The above-described modulus value that each of the bonding members 251, 252, 253, 254, 351, and 352 has may be the minimum modulus value for the display device 10 to withstand the stress applied to the bonding members 251, 252, 253, 254, 351, and 352 during the folding operation. When a low-frequency vibration is applied to the bonding members 251, 252, 253, 254, 351, and 352, that is, during normal behavior, such as during the folding operation of the display device 10, the bonding members 251, 252, 253, 254, 351, and 352 each including a viscoelastic material may have specific physical properties. In the exemplary embodiment, the physical property required for each of the bonding members 251, 252, 253, 254, 351, and 352 during the normal behavior is that the elastic modulus value measured at the ambient temperature of −20° C. is 300 kPa or less and the elastic modulus value measured at the ambient temperature of 25° C. is 50 kPa or less as described above.

Meanwhile, when an external impact is applied to the display device 10, changes in physical properties due to high-speed behavior may occur in the bonding members 251, 252, 253, 254, 351, and 352 each having the viscoelastic material in an environment in which a vibration at a frequency of tens of thousands of hertz (Hz), that is, the external impact, is applied. The bonding members 251, 252, 253, 254, 351, and 352 during the high-speed behavior may exhibit viscoelastic properties different from those exhibited during the normal behavior, and the external impact applied to the cover window 220 or the display panel 100 of the display device 10 may be mitigated depending on the viscoelastic properties that the bonding members 251, 252, 253, 254, 351, and 352 have during the high-speed behavior.

Specifically, when an external impact is applied to the front surface of the display device 10 such as the cover window 220 that is positioned in front of the display panel 100, vibrations of tens of thousands of hertz (Hz) may be transmitted to the bonding members 251, 252, 253, 254, 351, and 352 due to the impact. Since the cover window 220 and the display panel 100 include a material susceptible to the external impact, when such vibrations are directly transmitted to the cover window 220 or the display panel 100 through the bonding members 251, 252, 253, 254, 351, and 352, the cover window 220 may be broken or a portion of the display panel 100 may be damaged.

Meanwhile, the bonding members 251, 252, 253, 254, 351, and 352 each include the viscoelastic material as described above, and thus may exhibit physical properties of the high-speed behavior when the vibrations of tens of thousands of hertz (Hz) are transmitted thereto. The bonding members 251, 252, 253, 254, 351, and 352 that include the viscoelastic material may have physical properties of absorbing an external impact or preventing or suppress the impact from being transmitted to other members during the high-speed behavior. According to an exemplary embodiment, the bonding members 251, 252, 253, 254, 351, and 352 may have physical properties within a certain range during the high-speed behavior and may absorb or mitigate the impact that is applied to the members of the display device 10, for example, the cover window 220 and the display panel 100 due to the external impact.

Specifically, the bonding members 251, 252, 253, 254, 351, and 352 may have a storage modulus (G') and a loss tangent (tan δ) within a specific range during the high-speed behavior. The storage modulus (G') refers to energy stored without loss by the elasticity of a material. The greater the storage modulus (G') of a material, the closer the material may be to a perfect elastic body. Generally, the bonding members 251, 252, 253, 254, 351, and 352, which each have a viscoelastic material, may have a storage modulus (G') of a small value during the high-speed behavior from a low temperature to a high temperature and may react to an external impact more sensitively as the storage modulus has a smaller value. When the bonding members 251, 252, 253, 254, 351, and 352 have the storage modulus (G') of a small value when the external impact is transmitted to the bonding members 251, 252, 253, 254, 351, and 352 and thus the physical properties of the high-speed behavior are exhibited, the bonding members 251, 252, 253, 254, 351, and 352 may be sensitive to the external impact such that the external impact may be transmitted to other members that are attached to the bonding members 251, 252, 253, 254, 351, and 352. On the other hand, when the bonding members 251, 252, 253, 254, 351, and 352 have a storage modulus (G') of a large value when the physical properties of the high-speed behavior are exhibited, the bonding members 251, 252, 253, 254, 351, and 352 are not sensitive to the external impact and thus may be prevented or protected from being deformed due to the transmitted impact. That is, the bonding members 251, 252, 253, 254, 351, and 352 have the storage modulus (G') of a large value during the high-speed behavior, and thus an impact-sustaining effect is exhibited to prevent or suppress deformation due to the external impact.

Next, the loss tangent (tan δ) may be represented by Equation 1 below, $$\text{Loss tangent}(\tan \delta) = (\text{loss modulus})/(\text{storage modulus}) \quad [\text{Equation 1}]$$

where the loss modulus refers to energy lost by the viscosity of a material and the storage modulus refers to energy which is stored without loss by the elasticity of the material.

The smaller the value of the loss tangent (tan δ), the closer the material may be to a perfect elastic body. When the bonding members 251, 252, 253, 254, 351, and 352 have a loss tangent (tan δ) of a small value when the external impact is transmitted to the bonding members 251, 252, 253, 254, 351, and 352 and thus the physical properties of the high-speed behavior are exhibited, the bonding members 251, 252, 253, 254, 351, and 352 may be sensitive to the external impact such that the external impact may be transmitted to other members that are attached to the bonding members 251, 252, 253, 254, 351, and 352. On the other hand, when the bonding members 251, 252, 253, 254, 351, and 352 have the loss tangent (tan δ) of a large value when the physical properties of the high-speed behavior are expressed, that is, the loss of elasticity is great, the bonding members 251, 252, 253, 254, 351, and 352 may not be sensitive to the external impact and may absorb the impact. That is, the bonding members 251, 252, 253, 254, 351, and 352 have the loss tangent (tan δ) of a large value during the high-speed behavior, and thus the impact-absorbing effect is exhibited so that the external impact is not transmitted to other members.

When an external impact is applied to the front bonding members 251, 252, 253, 254 disposed in the front stacked structure 200 and the rear bonding members 351 and 352 disposed in the rear stacked structure 300 on the basis of the display panel 100, that is, during the high-speed behavior, the display device 10 may protect the display panel 100 from the external impact by controlling the physical properties. In this way, the display device 10 may protect the cover window 220 from the external impact by controlling physical properties, during the high-speed behavior, of the first bonding member 251 between the cover window 220 and the cover window protective layer 210 and the second bonding member 252 between the cover window 220 and the polarizing member 230 on the basis of the cover window 220.

According to an exemplary embodiment, loss tangents (tan δ) of the front bonding members 251, 252, 253, 254 disposed on one surface or in front of the display panel 100 may have a value larger than that of loss tangents (tan δ) of the rear bonding members 351 and 352 disposed on the other surface or in the rear of the display panel 100. Alternatively, the average value (the average of the loss tangent values of the bonding members belonging to the front bonding members 251, 252, 253, 254) of the loss tangents of the front bonding members 251, 252, 253, 254 may be greater than the average value (the average of the loss tangent values of the bonding members belonging to the rear bonding members 351 and 352) of the loss tangents of the rear bonding members 351 and 352. In addition, in some exemplary embodiments, a loss tangent (tan δ) of the first bonding member 251 disposed on one surface of the cover window 220 may have a value larger than that of a loss tangent (tan δ) of the second bonding member 252 disposed on the other surface of the cover window 220.

When an external impact is applied to the cover window 220 or the display panel 100 in front of the display device 10, vibrations of tens of thousands of hertz (Hz) may be transmitted to the front bonding members 251, 252, 253, 254. Due to the vibrations of tens of thousands of hertz (Hz), the front bonding members 251, 252, 253, 254 exhibit physical properties of the high-speed behavior. According to an exemplary embodiment, the front bonding members 251, 252, 253, 254 have the loss tangent (tan δ) of a large value during the high-speed behavior and thus may absorb the external impact, thereby minimizing the impact to be transmitted to the cover window 220 or the display panel 100.

Particularly, among the front bonding members 251, 252, 253, 254, the first bonding member 251 and the third bonding member 253 or the fourth bonding member 254, which are close to the cover window 220 or the display panel 100, may have a loss tangent (tan δ) of a relatively large value during the high-speed behavior. By disposing the bonding members, which have the loss tangent (tan δ) of a large value during the high-speed behavior, close to the cover window 220 and the display panel 100 that are to be protected from the external impact, the external impact may be effectively reduced.

Meanwhile, according to an exemplary embodiment, storage modulus (G') of the rear bonding members 351 and 352 that are disposed on the other surface or in the rear of the display panel 100 may have a value larger than that of storage modulus (G') of the front bonding members 251, 252, 253, 254 that are disposed on one surface or in front of the display panel 100. Alternatively, the average value (the average of the storage modulus values of the bonding members belonging to the rear bonding members 351 and 352) of the storage modulus of the rear bonding members 351 and 352 may be larger than the average value (the average of the storage modulus values of the bonding members belonging to the front bonding members 251, 252, 253, 254) of the storage modulus of the front bonding members 251, 252, 253, 254.

When an external impact is applied to the cover window 220 or the display panel 100 in front of the display device 10, vibrations of tens of thousands of hertz (Hz) may be transmitted to the front bonding members 251, 252, 253, 254 and the display panel 100. Among the vibrations, the vibrations that have not been absorbed by the front bonding members 251, 252, 253, 254 but have passed through the display panel 100 may be transmitted to the rear bonding members 351 and 352. Due to the vibrations of tens of thousands of hertz (Hz), the rear bonding members 351 and 352 exhibit physical properties of the high-speed behavior. According to an exemplary embodiment, the rear bonding members 351 and 352 have the storage modulus (G') of a large value during the high-speed behavior and may prevent or protect the display panel 100 from being deformed due to an external impact.

Particularly, among the rear bonding members 351 and 352, the fifth bonding member 351 positioned at a short distance from the display panel 100 may have a storage modulus (G') of a relatively large value during the high-speed behavior. By disposing the bonding members, which have the storage modulus (G') of a large value during the high-speed behavior, close to the display panel 100 that is to be protected from the external impact, deformation against the external impact may be effectively prevented or suppressed.

Further, in this way, the second bonding member 252 that is disposed between the cover window 220 and the polarizing member 230 may have a storage modulus (G') of a larger value during the high-speed behavior than the first bonding member 251 that is disposed between the cover window 220 and the cover window protective layer 210. The first bonding member 251 that is disposed in front of the cover window 220 has a loss tangent (tan δ) of a larger value during the high-speed behavior than the second bonding member 252 disposed in the rear of the cover window 220 so that the external impact may be effectively absorbed. On the other hand, the second bonding member 252 disposed in the rear of the cover window 220 has a storage modulus (G') of a larger value during the high-speed behavior than the first bonding member 251 disposed in front of the cover window 220 so that deformation against the external impact may be effectively prevented or suppressed.

Such physical properties of the bonding members 251, 252, 253, 254, 351, and 352 expressed during the high-speed behavior may be measured through a frequency sweep test at a wide range of temperatures. By applying vibrations to the bonding members 251, 252, 253, 254, 351, and 352 at a specific temperature while sweeping from a low frequency to a frequency of tens of thousands of hertz (Hz), the physical properties of the bonding members 251, 252, 253, 254, 351, and 352, which are exhibited during the high-speed behavior, for example, the storage modulus (G') or the loss tangent (tan δ), may be measured.

Alternatively, when transmitting a vibration having a frequency of tens of thousands of hertz (Hz) to the bonding members 251, 252, 253, 254, 351, and 352 is difficult, the physical properties of the bonding members 251, 252, 253, 254, 351, and 352, which are exhibited during the high-speed behavior, may be measured using a time-temperature superposition (TTS) principle.

Figure 7:
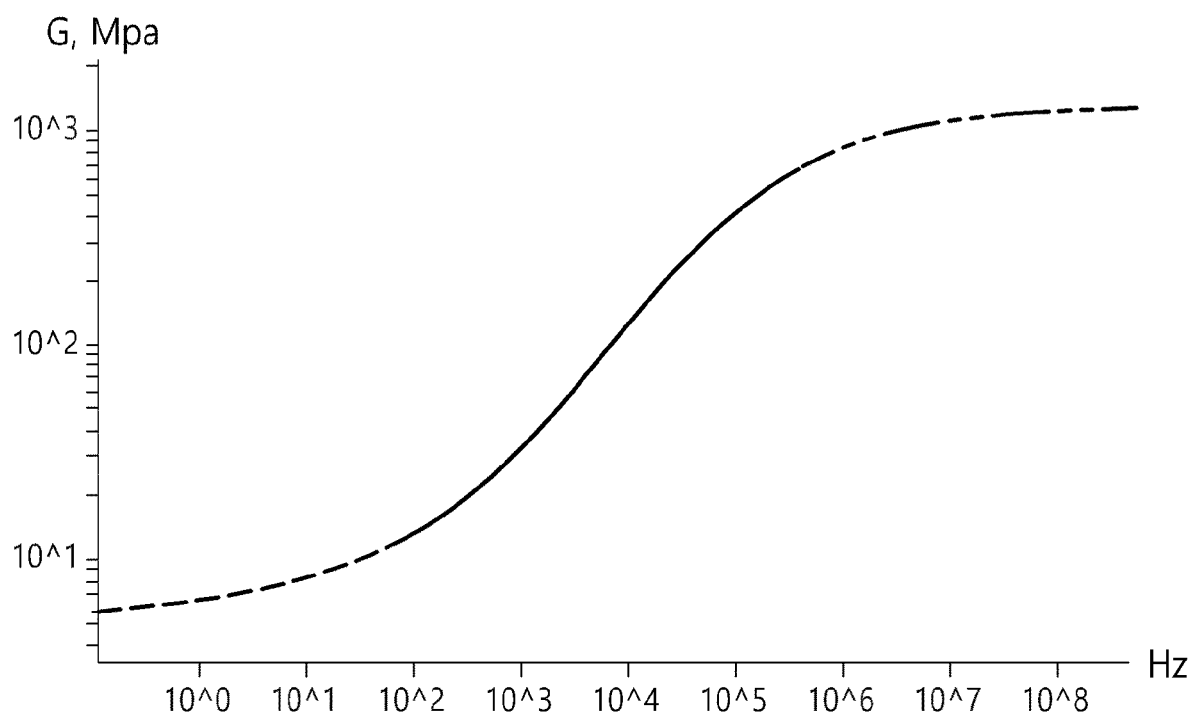
FIG. 7 is a graph illustrating a storage modulus according to a frequency of a bonding member according to an exemplary embodiment.

FIG. 7 is a graph illustrating a storage modulus according to a frequency of a bonding member according to an exemplary embodiment.

In a material such as each of the bonding members 251, 252, 253, 254, 351, and 352 that has viscoelastic properties, the viscoelastic properties may have a strong temperature dependency. The TTS principle may derive a change in the storage modulus (G') according to frequency through a change in the viscoelastic properties of the bonding members 251, 252, 253, 254, 351, and 352 such as the storage modulus (G') according to temperature. FIG. 7 illustrates the measurement of the storage modulus (G') of the bonding members 251, 252, 253, 254, 351, and 352 that have the viscoelastic material with respect to the frequency (Hz) through the TTS principle.

Meanwhile, in the exemplary embodiments, the bonding members 251, 252, 253, 254, 351, and 352 may have a storage modulus (G') or loss tangent (tan δ) value of a certain level during the high-speed behavior of 30,000 Hz or more to mitigate the external impact applied to the display device 10. As described above, the front bonding members 251, 252, 253, 254 positioned in front of the display panel 100 or the cover window 220 may have the loss tangent (tan δ) of a large value, and the rear bonding members 351 and 352 positioned in the rear of the display panel 100 or the cover window 220 may have the storage modulus (G') of a large value.

In an exemplary embodiment, at least some of the front bonding members 251, 252, 253, 254, such as the first bonding member 251, the second bonding member 252, the third bonding member 253, and the fourth bonding member 254, may have a loss tangent (tan δ) of 1.5 or more that is measured during a high-speed behavior of 30,000 Hz or more at 25° C. Alternatively, the average value of the loss tangents (tan δ) of the front bonding members 251, 252, 253, 254 such as the first bonding member 251, the second bonding member 252, the third bonding member 253, and the fourth bonding member 254 may also be 1.5 or more. For example, the first bonding member 251 that is disposed between the cover window 220 and the cover window protective layer 210 and the third bonding member 253 (illustrated in FIG. 5) or the fourth bonding member 254 (illustrated in FIG. 3) that is disposed in front of the display panel 100 may have a loss tangent (tan δ) of 1.5 more that is measured during the high-speed behavior of 30,000 Hz or more at 25° C. As described above, the bonding members 251, 252, 253, 254, 351, and 352 have the loss tangent (tan δ) of a large value, and thus may have viscoelastic properties capable of absorbing an external impact. When an external impact is applied to the front of the display device 10, at least one of the first bonding member 251, the third bonding member 253, and the fourth bonding member 254 may exhibit physical properties of the high-speed behavior and have a loss tangent (tan δ) of 1.5 or more, thereby absorbing the impact. Since at least one of the first bonding member 251, the third bonding member 253, and the fourth bonding member 254 has a loss tangent (tan δ) of a large value, most of the impact transmitted is absorbed and thus the impact transmitted to the cover window 220 or the display panel 100 may be minimized.

In some exemplary embodiments, the front bonding member such as the third bonding member 253 or the fourth bonding member 254 that is disposed on the display panel 100 may have a larger value of loss tangent (tan δ) than the first bonding member 251 that is the window bonding member disposed on the cover window 220. The bonding members 251, 252, 253, 254, 351, and 352 that have a loss tangent (tan δ) of a large value in the display device 10 may be disposed adjacent to the cover window 220 and the display panel 100. Among these cases, in the case of the display panel 100, since the display panel 100 may include a material that is more susceptible to an external impact than the cover window 220, the front bonding member disposed on the display panel 100 may have a larger value of loss tangent (tan δ) than the window bonding member disposed on the cover window 220. However, the present disclosure is not limited thereto.

In addition, in an exemplary embodiment, at least some of the rear bonding members 351 and 352 such as the fifth bonding member 351 and the sixth bonding member 352 may have a storage modulus (G') of 2 MPa or more that is measured during a high-speed behavior of 30,000 Hz or more at the temperature of 25° C. Alternatively, the average value of the storage modulus (G') of the rear bonding members 351 and 352 such as the fifth bonding member 351 and the sixth bonding member 352 may be 2 MPa or more. For example, the fifth bonding member 351 that is a rear bonding member disposed in the rear of the display panel 100 may have a storage modulus (G') of 2 MPa or more that is measured during a high-speed behavior of 30,000 Hz or more at the temperature of 25° C. As described above, the bonding members 251, 252, 253, 254, 351, and 352 have a storage modulus (G') of a large value, and thus may have viscoelastic properties that may be insensitive to an external impact. When an external impact is applied to the front of the display device 10, at least one of the rear bonding members 351 and 352 may exhibit the physical properties of the high-speed behavior, have a storage modulus (G') of 2 MPa or more, and prevent or suppress deformation of the display panel 100 due to the impact.

In some exemplary embodiments, the rear bonding member, such as the fifth bonding member 351 or the sixth bonding member 352 which is disposed in the rear of the display panel 100, may have a larger value of storage modulus (G') than the front bonding members such as the first bonding member 251, the second bonding member 252, the third bonding member 253, and the fourth bonding member 254 which are disposed in front of the display panel 100. The bonding members 251, 252, 253, 254, 351, and 352 having a storage modulus (G') of a large value in the display device 10 are positioned in the rear of the display panel 100 to sustain the transmitted impact, thereby preventing or protecting the display panel 100 from being deformed due to the impact. However, the present disclosure is not limited thereto.

Further, on the basis of the cover window 220, the first bonding member 251 disposed in front of the cover window 220 may have a loss tangent (tan δ) of a larger value but may have a storage modulus (G') of a smaller value than the second bonding member 252 disposed in the rear of the cover window 220. In some exemplary embodiments, the first bonding member 251 may have a loss tangent (tan δ) of 1.5 or more that is measured during a high-speed behavior of 30,000 Hz or more at the temperature of 25° C., and the second bonding member 252 may have a storage modulus (G') of 2 MPa or more that is measured during a high-speed behavior of 30,000 Hz or more at the temperature of 25° C. Accordingly, due to the first bonding member 251 and the second bonding member 252, the cover window 220 may be prevented or protected from being damaged or deformed by an external impact.

The effect of mitigating an impact resistance of the display device 10 due to such physical properties of the bonding members 251, 252, 253, 254, 351, and 352, which are exhibited during the high-speed behavior, may be confirmed through a pen drop test that uses the display device 10.

Figure 8:
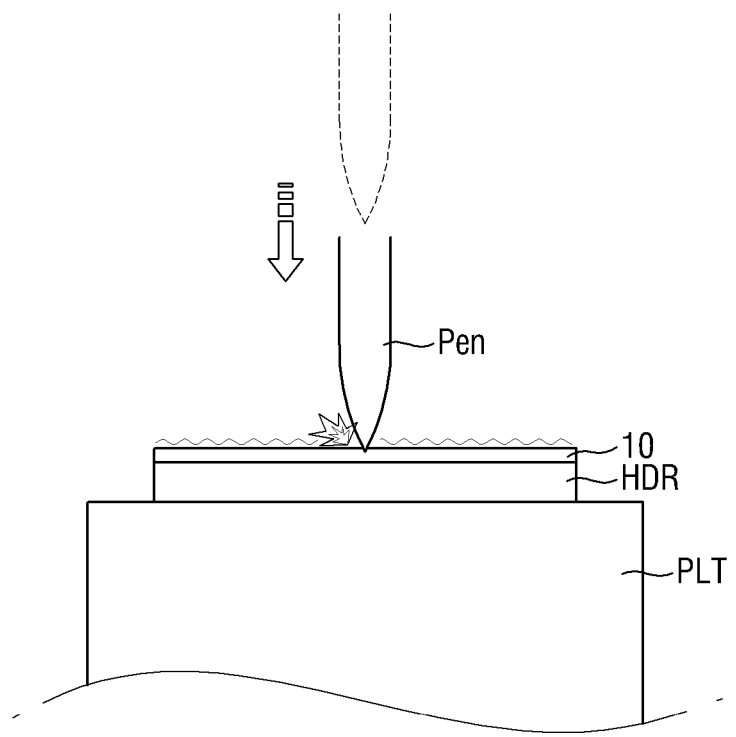
FIG. 8 is a schematic view illustrating a pen drop test method according to an exemplary embodiment.
Figure 9:
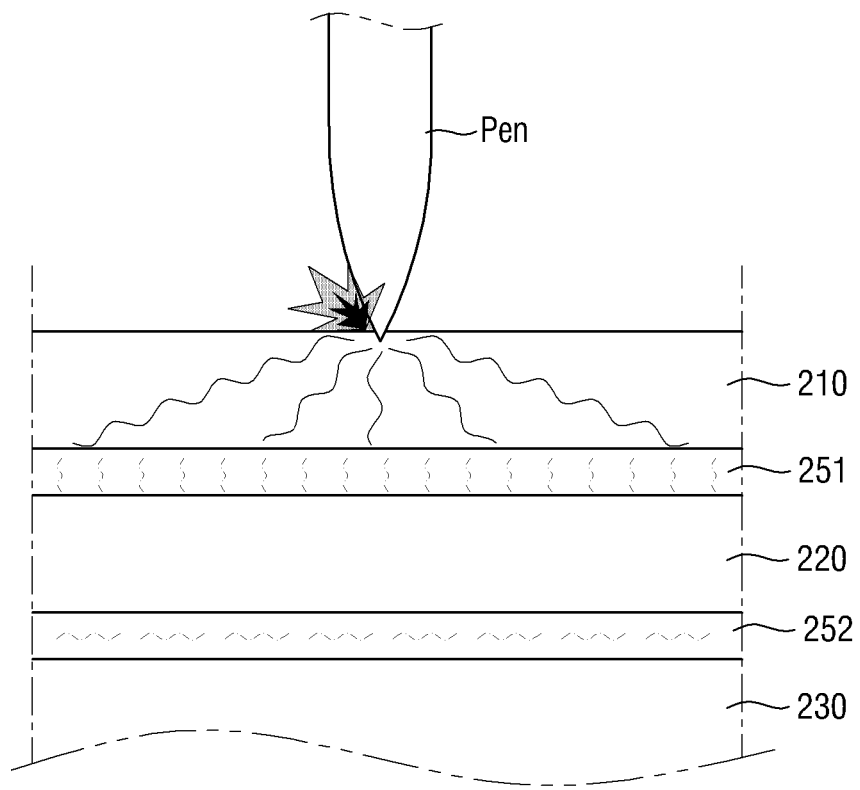
FIG. 9 is a schematic view illustrating that an impact applied to the display device according to an exemplary embodiment is transmitted to the bonding member and a cover window.
Figure 10:
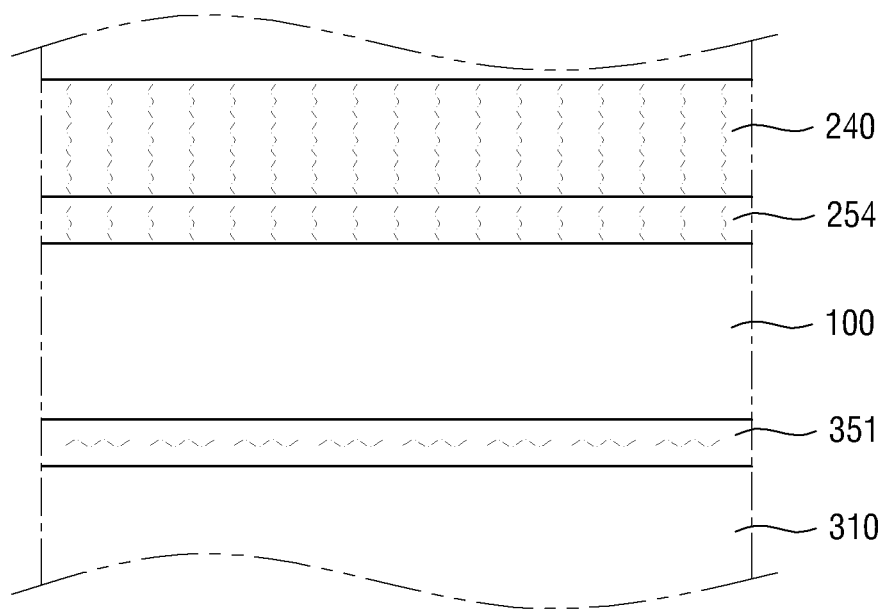
FIG. 10 is a schematic view illustrating that an impact applied to the display device according to an exemplary embodiment is transmitted to the bonding member and the display panel.

FIG. 8 is a schematic view illustrating a pen drop test method according to an exemplary embodiment. FIG. 9 is a schematic view illustrating that an impact applied to the display device according to an exemplary embodiment is transmitted to the bonding member and the cover window. FIG. 10 is a schematic view illustrating that an impact applied to the display device according to an exemplary embodiment is transmitted to the bonding member and the display panel.

First, referring to FIG. 8, a pen drop test may be performed by dropping a pen at a predetermined height on the front of the display device 10. The display device 10 is positioned in a holder HDR on a plate PLT, and on the front of the display device 10, the pen is dropped at different heights to impact the display device 10. When it is first observed that the display device 10 is broken by the pen that has fallen on the front of the display device 10, the height at which the pen has fallen is measured, and thus the effect of mitigating the impact resistance by the bonding members 251, 252, 253, 254, 351, and 352 of the display device 10 may be measured. This may mean that the greater the height of the pen when the damage is first observed in the display device 10, the more the impact resistance by the bonding members 251, 252, 253, 254, 351, and 352 is mitigated.

Referring to FIGS. 9 and 10, when the pen is dropped on the front of the display device 10, an impact is applied to the cover window protective layer 210 of the display device 10. The impact may be transmitted to the first bonding member 251, the cover window 220, and the second bonding member 252 through the cover window protective layer 210. As described above, the first bonding member 251 disposed in front of the cover window 220 has the loss tangent (tan δ) of a large value to absorb the impact transmitted through the cover window protective layer 210. Thus, the impact transmitted by dropping the pen may be absorbed in the first bonding member 251, and only a small amount of impact may be transmitted to the cover window 220 so that the cover window 220 may be protected. Further, the second bonding member 252 disposed in the rear of the cover window 220 has a storage modulus (G') of a large value so that the second bonding member 252 may not be sensitive to an impact even when the impact is transmitted through the cover window 220. Thus, the second bonding member 252 may prevent or protect the cover window 220 from being deformed due to the transmitted impact.

In this way, when the pen is dropped on the front of the display device 10, an impact may also be applied to the display panel 100. The impact may be transmitted to the fourth bonding member 254, the display panel 100, and the fifth bonding member 351. As described above, the fourth bonding member 254 disposed in front of the display panel 100 has the loss tangent (tan δ) of a large value to absorb the impact transmitted through the front stacked structure 200. Thus, the impact transmitted by dropping the pen may be absorbed in the fourth bonding member 254, and only a small amount of impact may be transmitted to the display panel 100 to protect the display panel 100. Further, the fifth bonding member 351 disposed in the rear of the display panel 100 has a storage modulus (G') of a large value so that the fifth bonding member 351 may not be sensitive to an impact even when the impact is transmitted through the display panel 100. Thus, the fifth bonding member 351 may prevent or protect the display panel 100 from being deformed by the transmitted impact.

Figure 11:
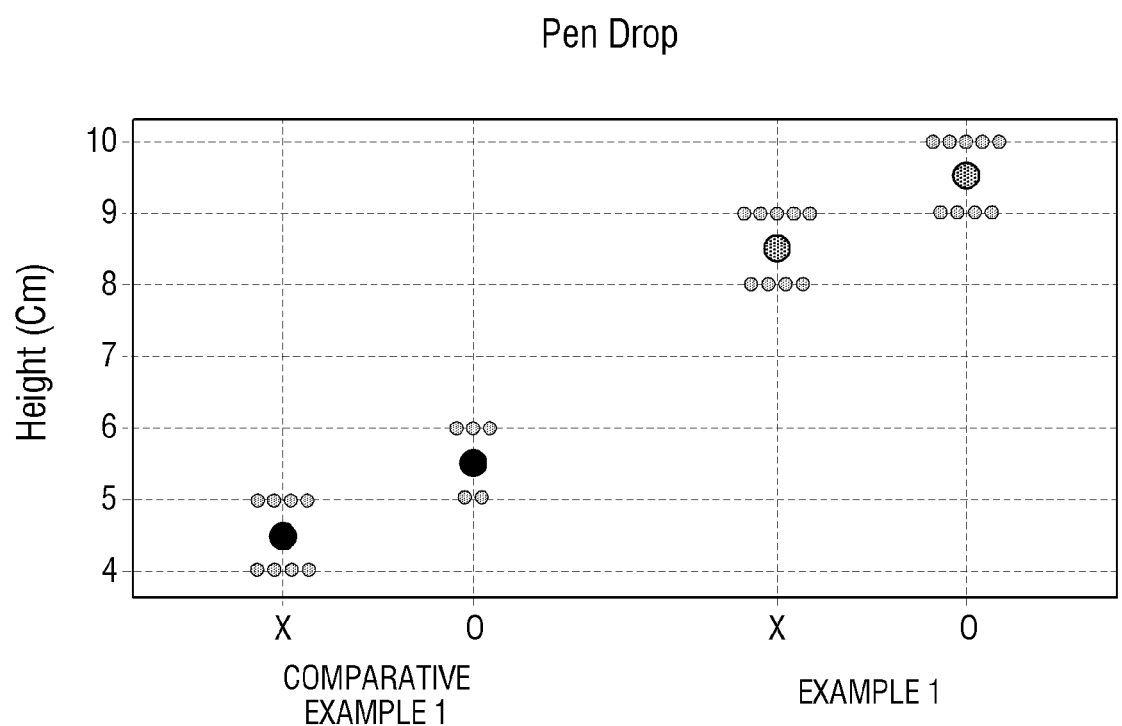
FIG. 11 is a graph illustrating the results of a pen drop test in the display device according to an exemplary embodiment.

FIG. 11 is a graph illustrating the results of the pen drop test in the display device according to an exemplary embodiment.

As described above, a display device 10 (Example 1) including a front stacked structure having a front bonding member which has a loss tangent (tan δ) of 1.5 or more during high-speed behavior, a rear stacked structure having a rear bonding member which has a storage modulus (G') of 2 MPa or more during the high-speed behavior, a display panel 100, and a cover window 220, and a display device 10 (Comparative Example 1) that does not have physical properties of the high-speed behavior were prepared. Pen drop tests were performed five to nine times using the display device 10 of Example 1 and the display device 10 of Comparative Example 1, respectively. Thereafter, the average heights of the pens when bright spots were formed on the display panel 100 of Example 1 and the display panel 100 of Comparative Example 1 were measured, and the results are shown in FIG. 11 and Table 1 below.

TABLE 1

|  | Comparative Example 1 | | Example 1 | |
| --- | --- | --- | --- | --- |
| Pen Drop | X | O | X | O |
| Height | 4 cm | 5 cm | 8 cm | 9 cm |

Referring to FIG. 11 and Table 1, it may be seen that the height of the pen, in which the bright spot is formed on the display panel 100 is increased by an average of 4 cm or more in Example 1 including the bonding members according to an exemplary embodiment, each of which has a loss tangent (tan δ) of a large value and a storage modulus (G') of a large value during the high-speed behavior, in comparison with Comparative Example 1 including the bonding members that do not have the physical properties of the bonding members of Example 1. That is, the display device 10 according to an exemplary embodiment includes the bonding members that have the loss tangent (tan δ) of a large value and the storage modulus (G') of a large value during the high-speed behavior to absorb an external impact applied to the display device 10 or to prevent or suppress deformation of the display panel 100 or the cover window 220 due to the impact. That is, the display device 10 according to an exemplary embodiment may prevent or suppress damage or deformation due to an external impact.

Hereinafter, display devices according to another exemplary embodiment will be described.

Figure 12:
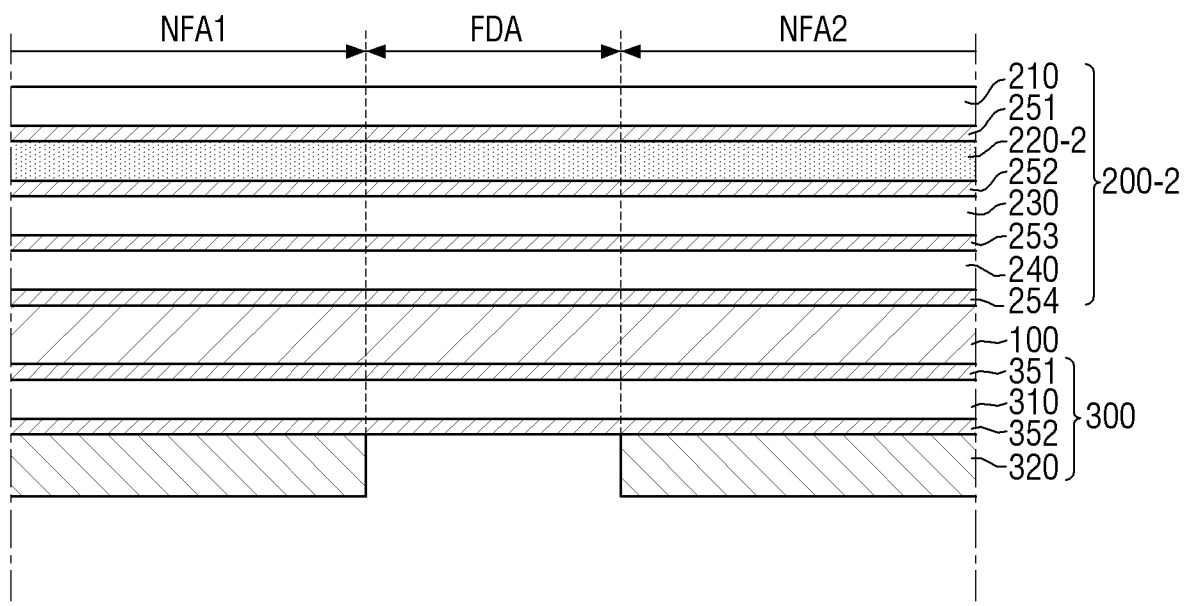
FIGS. 12 and 13 are cross-sectional views of display devices according to another exemplary embodiment.
Figure 13:
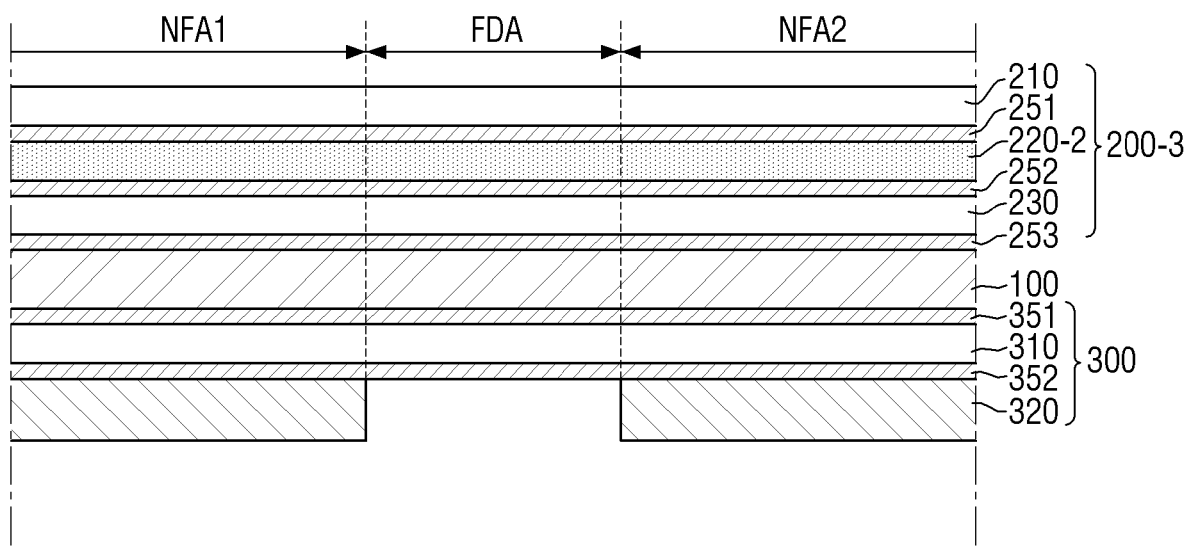
Figure 14:
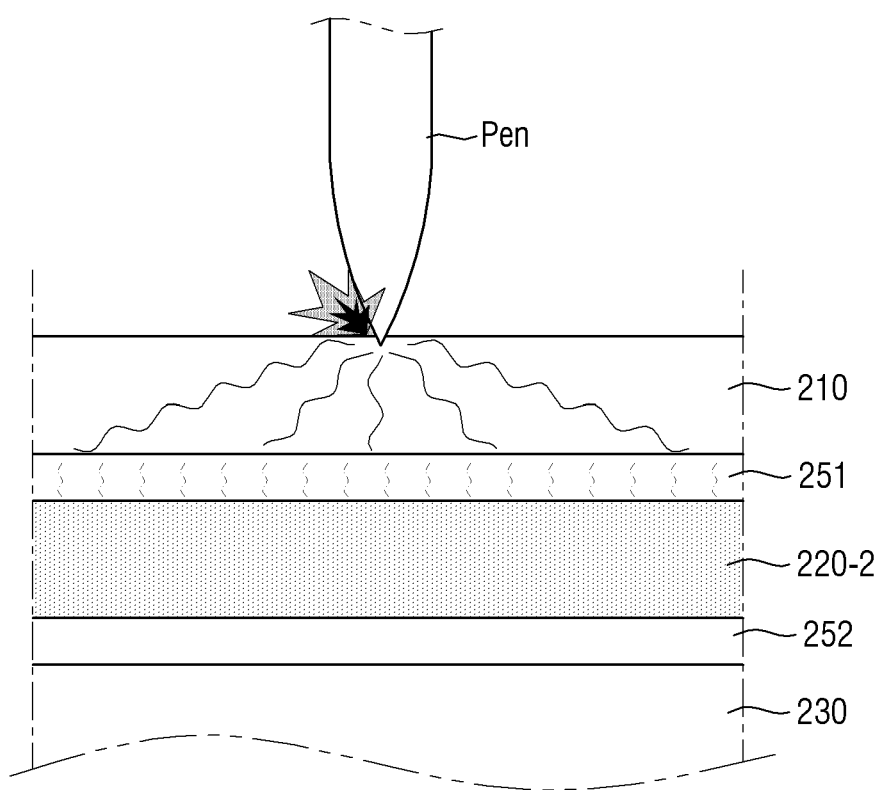
FIG. 14 is a schematic view illustrating that an impact applied to the display devices of FIGS. 12 and 13 is transmitted to a bonding member and a cover window.

FIGS. 12 and 13 are cross-sectional views of the display devices according to another exemplary embodiment. FIG. 14 is a schematic view illustrating that the impact applied to the display devices of FIGS. 12 and 13 is transmitted to the bonding member and the cover window.

Referring to FIGS. 12 and 13, display devices 11 and 12 according to an exemplary embodiment differ from the exemplary embodiments of FIG. 3 and FIG. 5 in that the front stacked structure 200-2 and the front stacked structure 200-3 includes a cover window 220-2 including a plastic substrate. In this case, the cover window 220-2 may be resistant to deformation against an external impact, unlike the cover window 220 of FIG. 3 and the cover window 220 of FIG. 5, and a bonding member disposed in the rear of the cover window 220-2, for example, a second bonding member 252 may have a storage modulus (G') of 2 MPa or less during high-speed behavior. Since the display devices 11 and 12 of FIGS. 12 and 13 are the same as the display device 10 of FIG. 3 and the display device 10 of FIG. 5 except that the cover window 220-2 includes a plastic substrate, duplicate descriptions will be omitted.

When the cover window 220-2 includes a plastic substrate, the cover window 220-2 may be relatively resistant to deformation against an external impact by flexible characteristics thereof. When the cover window 220 of the display device 10 of FIG. 3 and the cover window 220 of the display device 10 of FIG. 5 are formed of glass, or ultra-thin glass or thin glass, the cover window 220 may be broken due to the deformation by an impact when the impact is not sustained at the rear of the cover window 220. Accordingly, in the display device 10 of FIG. 3 and the display device 10 of FIG. 5, the second bonding member 252 disposed in the rear of the cover window 220 may have a storage modulus (G') of 2 MPa or more during the high-speed behavior.

On the other hand, when the cover window 220-2 is formed of a plastic substrate like in the display devices 11 and 12 of FIGS. 12 and 13, the cover window 220-2 may be less likely to be deformed and broken due to an external impact even when the impact is applied thereto by flexible characteristics thereof. In this case, in the exemplary embodiment, the second bonding member 252 may have the storage modulus (G') of a value of 2 MPa or less during the high-speed behavior and may have a slightly smaller impact-sustaining property. However, the present disclosure is not limited thereto.

Referring to FIGS. 12 and 13, the touch member 240 is provided in the form of a separate touch layer TSL in the display panel 100, and therefore, the touch member 240 and the fourth bonding members 254 for bonding the touch member 240 and the display panel 100 to each other may be omitted from the front stacked structure 200-2 of the display device 13. The display device 13 of FIG. 13 is the same as the display device 12 of FIG. 12 except that the touch member 240 is separately provided in the form of the touch layer TSL in the display panel 100 so that the fourth bonding member 254 is omitted. Thus, duplicated descriptions will be omitted.

Figure 15:
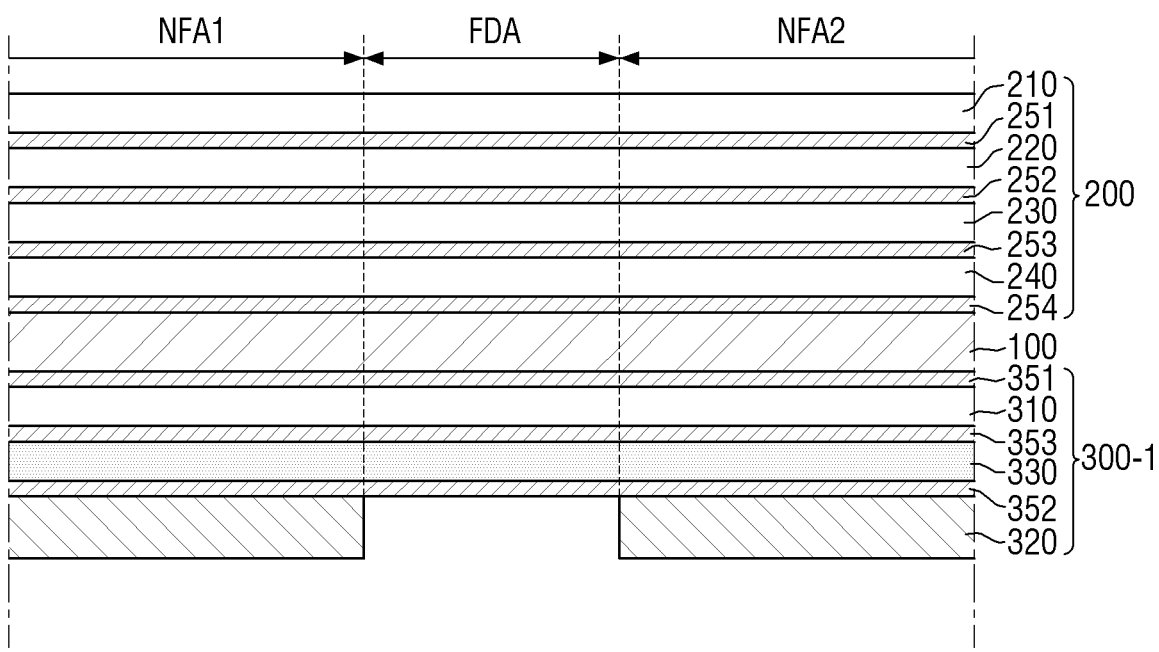
FIGS. 15 and 16 are cross-sectional views of display devices according to yet another exemplary embodiment.
Figure 16:
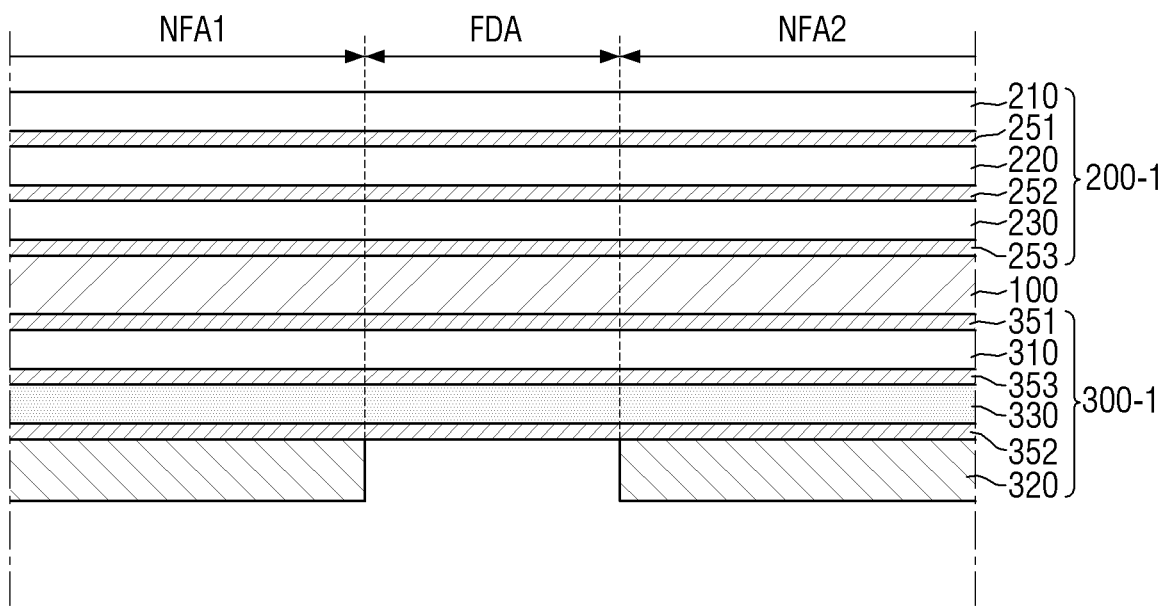

FIGS. 15 and 16 are cross-sectional views of display devices according to yet another exemplary embodiment.

Referring to FIGS. 15 and 16, display devices 14 and 15 according to an exemplary embodiment differ from those of FIGS. 3 and 5 in that a rear stacked structure 300-1 further includes a buffer member 330 and a seventh bonding member 353. That is, it may be understood that the display device 14 of FIG. 15 further includes the buffer member 330 and the seventh bonding member 353 in the display device 10 of FIG. 3, and the display device 15 of FIG. 16 further includes the buffer member 330 and the seventh bonding member 353 in the display device 10 of FIG. 5.

In more detail, the buffer member 330 may be disposed between the polymer film layer 310 and the heat dissipation member 320. The buffer member 330 may play a role of absorbing an external impact to prevent or protect the display devices 15 and 16 from being damaged. The buffer member 330 may be formed of a single layer or a plurality of stacked layers. The buffer member 330 may include, for example, a material having elasticity such as a polyurethane or polyethylene resin. The buffer member 330 may be a cushion layer.

The seventh bonding member 353 is disposed between the buffer member 330 and the polymer film layer 310 to bond the buffer member 330 and the polymer film layer 310. A sixth bonding member 352 may be disposed between the buffer member 330 and the heat dissipation member 320 to bond the buffer member 330 and the heat dissipation member 320. The seventh bonding member 353 may be a buffering portion bonding member that attaches the buffer member 330 on the other surface of a display panel 100.

The seventh bonding member 353 may have adhesive physical properties similar to those of the sixth bonding member 352. That is, in an exemplary embodiment, the seventh bonding member 353 may have a thickness within a thickness range that is the same as or applicable to the sixth bonding member 352 and a storage modulus of 2 MPa or more, that is, measured during high-speed behavior of 30,000 Hz at 25° C. Accordingly, the seventh bonding member 353 may also have characteristics of sustaining an external impact to prevent or protect the display panel 100 from being deformed due to the external impact. The description thereof is the same as that described above, and thus will be omitted.

FIG. 17 is a cross-sectional view of a display device in a folded state according to yet another exemplary embodiment.

Referring to FIG. 17, a display device 16 according to the present embodiment has the same stacked structure as the exemplary embodiment of FIG. 4 but differs from the exemplary embodiment of FIG. 4 in that folding is performed by an out-folding method in which a display surface faces outward. The display device 19 of FIG. 17 is the same as the display device 10 of FIG. 4, except that the direction of a display surface of the folded display device 19 is different from that of the display device 10 of FIG. 4, and thus, hereinafter, duplicated descriptions will be omitted.

A display device according to an exemplary embodiment can include a front bonding member that has a loss tangent of a large value during high-speed behavior and a rear bonding member that has a storage modulus of a large value during the high-speed behavior. That is, the display device can include bonding members capable of absorbing an external impact and preventing or suppressing deformation due to the external impact so that the display device can prevent or suppress damage and deformation of a cover window and a display panel against the external impact.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
   a display panel comprising:
      a first surface facing a front side of the display panel; and
      a second surface facing a rear side of the display panel, the rear side being opposite to the front side;

a front stacked structure on the first surface of the display panel, the front stacked structure comprising a front bonding member disposed on the first surface of the display panel; and a rear stacked structure on the second surface of the display panel, the rear stacked structure comprising a rear bonding member disposed on the second surface of the display panel, wherein a loss tangent of the front bonding member has a value greater than a loss tangent of the rear bonding member, the loss tangent of the front bonding member and the rear bonding member being represented by a following equation:

(loss tangent)=(loss modulus)/(storage modulus), wherein the loss modulus of the front bonding member and the rear bonding member refers to energy lost by viscosity of a material of the front bonding member and the rear bonding member, wherein the storage modulus the front bonding member and the rear bonding member refers to energy stored without loss by elasticity of the material of the front bonding member and the rear bonding member, and wherein the display panel displays an image toward the front side, and is an in-foldable display device configured to fold in such a way that a display surface faces inward.

2. The display device of claim 1, wherein the storage modulus of the rear bonding member has a larger value than the storage modulus of the front bonding member.

3. The display device of claim 2, wherein an average value of the loss tangent of the front bonding member is equal to or greater than 1.5 at an ambient temperature of 25° C., and wherein an average value of the storage modulus of the rear bonding member is equal to or greater than 2 MPa at the ambient temperature of 25° C.

4. The display device of claim 3, wherein the values of the loss tangent and the storage modulus of the front bonding member and the rear bonding member are measured during a high-speed behavior of equal to or greater than 30,000 Hz at the ambient temperature of 25° C.

5. The display device of claim 2, wherein each of the front bonding member and the rear bonding member has a thickness equal to or less than 50 μm.

6. The display device of claim 5, wherein each of the front bonding member and the rear bonding member has an elastic modulus of:

equal to or less than 300 kPa at the ambient temperature of −20° C.; and equal to or less than 50 kPa at the ambient temperature of 25° C.

7. A display device comprising:
a display panel comprising:
a first surface facing a front side of the display panel; and
a second surface facing a rear side of the display panel, the rear side being opposite to the front side;
a front stacked structure on the first surface of the display panel, the front stacked structure comprising a front bonding member disposed on the first surface of the display panel; and
a rear stacked structure on the second surface of the display panel, the rear stacked structure comprising a rear bonding member disposed on the second surface of the display panel, wherein a loss tangent of the front bonding member has a value greater than a loss tangent of the rear bonding member, the loss tangent of the front bonding member and the rear bonding member being represented by a following equation:

(loss tangent)=(loss modulus)/(storage modulus), wherein the loss modulus of the front bonding member and the rear bonding member refers to energy lost by viscosity of a material of the front bonding member and the rear bonding member, and wherein the storage modulus the front bonding member and the rear bonding member refers to energy stored without loss by elasticity of the material of the front bonding member and the rear bonding member, wherein the front stacked structure comprises:
a cover window;
a window bonding member attaching the cover window to the first surface of the display panel;
a cover window protective layer disposed in front of the cover window; and
a protective layer bonding member attaching the cover window protective layer on the cover window, and wherein a loss tangent of the protective layer bonding member has a larger value than a loss tangent of the window bonding member.

8. The display device of claim 7, wherein the loss tangent of the front bonding member has a larger value than the loss tangent of the window bonding member.

9. The display device of claim 7, wherein a storage modulus of the window bonding member has a larger value than a storage modulus of the protective layer bonding member and has a smaller value than a storage modulus of the rear bonding member.

10. The display device of claim 9, wherein the front stacked structure further comprises:
a polarizing member disposed between the display panel and the cover window; and
a polarizing member bonding member attaching the polarizing member on the first surface of the display panel, and
wherein a storage modulus of the polarizing member bonding member has a smaller value than the storage modulus of the rear bonding member.

11. The display device of claim 7, wherein the rear stacked structure comprises:
a polymer film layer disposed on the second surface of the display panel; and
a heat dissipation member disposed on the polymer film layer.

12. The display device of claim 11, wherein the rear stacked structure further comprise:
a polymer film bonding member attaching the polymer film layer on the second surface of the display panel; and
a heat dissipation member bonding member attaching the heat dissipation member on the second surface of the display panel, and
wherein an average value of storage modulus of the polymer film bonding member and the heat dissipation member bonding member are larger than an average value of storage modulus of the window bonding member and the protective layer bonding member.

13. The display device of claim 12, wherein an average value of loss tangents of the window bonding member and the protective layer bonding member are larger than an average value of loss tangents of the polymer film bonding member and the heat dissipation member bonding member.

14. A display device comprising an in-foldable device configured to fold in such a way that a display surface faces inward, the display device comprising:
  a display panel including a first surface positioned on a front side of the display panel and a second surface positioned on a rear side of the display panel, the display panel configured to display an image on the front side toward the display surface;
  a front stacked structure disposed on the first surface of the display panel; and
  a rear stacked structure disposed on the second surface of the display panel,
  wherein the front stacked structure and the rear stacked structure each comprises at least one bonding member each having a thickness equal to or less than 50 μm, and
  wherein an average value of a loss tangent of the at least one bonding member of the front stacked structure is larger than an average value of a loss tangent of the at least one bonding member of the rear stacked structure, the loss tangent of the at least one bonding member of the front and rear stacked structures being represented by a following equation:

(loss tangent)=(loss modulus)/(storage modulus), wherein the loss modulus of the at least one bonding member refers to energy lost by viscosity of a material of the at least one bonding member, and
  wherein the storage modulus of the at least one bonding member refers to energy stored without loss by elasticity of the material of the at least one bonding member.

15. The display device of claim 14, wherein the average value of the storage modulus of the at least one bonding member of the rear stacked structure is larger than an average value of storage modulus of the front stacked structure.

16. The display device of claim 15, wherein an average value of the loss tangent of each of the at least one bonding member of the front stacked structure is equal to or greater than 1.5 at the ambient temperature of 25° C., and
  wherein an average value of the storage modulus of each of the at least one bonding member of the rear stacked structure is equal to or greater than 2 MPa at the ambient temperature of 25° C.

17. The display device of claim 16, wherein the values of the loss tangents and the storage modulus of the at least one bonding member of the front stacked structure and the rear stacked structure are measured during a high-speed behavior of equal to or greater than 30,000 Hz at the ambient temperature of 25° C.

18. The display device of claim 17, wherein the at least one bonding member of the front stacked structure and the at least one bonding member of the rear stacked structure have an elastic modulus equal to or less than 300 kPa at the ambient temperature of −20° C. and a modulus equal to or less than 50 kPa at the ambient temperature of 25° C., respectively.

* * * * *